(12) United States Patent
Horch

(10) Patent No.: US 8,194,468 B2
(45) Date of Patent: *Jun. 5, 2012

(54) NON-VOLATILE MEMORY CELL WITH BTBT PROGRAMMING

(75) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/158,002

(22) Filed: Jun. 10, 2011

(65) Prior Publication Data

US 2011/0255348 A1    Oct. 20, 2011

Related U.S. Application Data

(63) Continuation of application No. 12/410,417, filed on Mar. 24, 2009, now Pat. No. 7,983,093, which is a continuation-in-part of application No. 11/601,305, filed on Nov. 16, 2006, now Pat. No. 7,508,719, and a continuation-in-part of application No. 12/080,127, filed on Mar. 31, 2008, now Pat. No. 7,652,921.

(60) Provisional application No. 60/839,771, filed on Aug. 24, 2006, provisional application No. 60/928,762, filed on May 11, 2007.

(51) Int. Cl.
*G11C 16/04*    (2006.01)

(52) U.S. Cl. ........... 365/185.29; 365/185.1; 365/185.05; 365/185.26

(58) Field of Classification Search ............. 365/185.29, 365/185.1, 185.05, 185.26
See application file for complete search history.

(56) References Cited

U.S. PATENT DOCUMENTS

| | | | |
|---|---|---|---|
| 7,508,719 B2 * | 3/2009 | Horch | 365/185.28 |
| 7,652,921 B2 * | 1/2010 | Horch et al. | 365/185.1 |
| 7,859,043 B2 * | 12/2010 | Pikhay et al. | 257/315 |
| 7,983,093 B2 * | 7/2011 | Horch | 365/185.29 |

* cited by examiner

*Primary Examiner* — Connie Yoha
(74) *Attorney, Agent, or Firm* — Fenwick & West LLP

(57) ABSTRACT

A Non-Volatile Memory (NVM) cell and programming method in which the cell can denote at least two logic levels (e.g., 0 and 1) and includes a read-transistor with a floating gate and a Band-To-Band-Tunneling device (BTBT device) sharing the floating gate with the read transistor.

The BTBT device is configured as an injection device for injecting a first charge onto the floating gate when the BTBT device is biased so that it is in accumulation, to set at least one of the logic levels.

20 Claims, 23 Drawing Sheets

CROSS SECTION OF HIGH-VT ENHANCED BTBT
PMOS INJECTION DEVICE WITH VT ADJUST IMPLANT

CROSS SECTION OF HIGH-VT ENHANCED BTBT
PMOS INJECTION DEVICE WITH N+ POLY GATE

CROSS SECTION OF ENHANCED BTBT N+ POLY
NMOS INJECTION DEVICE WITHOUT LDD IMPLANT

CROSS SECTION OF ENHANCED BTBT P+ POLY
PMOS INJECTION DEVICE WITHOUT LDD IMPLANT

CROSS SECTION OF ENHANCED BTBT P+ POLY GATE NMOS INJECTION DEVICE WITHOUT LDD IMPLANT

CROSS SECTION OF ENHANCED BTBT N+ POLY PMOS INJECTION DEVICE WITHOUT LDD IMPLANT

CROSS SECTION OF ENHANCED BTBT
NMOS WITHOUT SOURCE (Q13)

1150A

| OPERATION / VOLTAGES | SOURCE/NWELL | READ S | BTBT. S | TUN. |
|---|---|---|---|---|
| PROGRAM | VDD_IO x 2 | 0 | 0 | VDD_IO x 2 |
| READ | VDD_L | 0 | 0 | VDD_L |
| ERASE | 0 | 0 | 0 | VDD_IO x 3 |

*CONTROL VOLTAGE LEVEL DURING OPERATIONS OF NVN CELL OF FIG. 3A WITH REGULAR ENHANCED BTBT*

| OPERATION / VOLTAGES | SOURCE/NWELL | READ S | PROG. S | TUN. |
|---|---|---|---|---|
| PROGRAM | VBTBT | 0 | VDD_IO | VTUN |
| READ | VDD_L | VDD_IO | 0 | 0 |
| ERASE | 0 | 0 | VDD_IO | VTUN |

*CONTROL VOLTAGE LEVEL DURING OPERATIONS OF NVN CELL OF FIG.7A WITH HIGH-VT ENHANCED BTBT*

FIG. 11B

*METHOD OF PROGRAMMING A NVM CELL WITH A HIGH-VT ENHANCED BTBT*

FG WITH ML (2 BITS EXAMPLE)

| ACTION | ST. DATA | BIT LINE | SOURCE | READ SEL. L. | TUN | PROGRAM SEL. L. |
|---|---|---|---|---|---|---|
| ERASE | 00 | 0 | 0 | V1 | VTUN | V1 |
| WRITE | 01 | 0 | V2 | 0 | V5 | V1 |
| WRITE | 10 | 0 | V3 | 0 | V6 | V1 |
| WRITE | 11 | 0 | V4 | 0 | V7 | V1 |

ML PROGRAMMING CONDITIONS OF NVN CELL OF FIG.7A

FIG. 16A — MEMORY CELL USING HIGH-VT ENHANCED BTBT PMOS FOR WRITING

| ACTION | ST. DATA | BIT LINE | SOURCE/ NWELL | READ SEL. L. | PROG. | PROGRAM SEL. L. | TUN |
|---|---|---|---|---|---|---|---|
| ERASE | 00 | 0 | 0 | 0 | 0 | 0 | VTUN |
| WRITE | 01 | V1 | V1 | 0 | 0 | 0 | V4 |
| WRITE | 10 | V2 | V2 | 0 | 0 | 0 | V5 |
| WRITE | 11 | V3 | V3 | 0 | 0 | 0 | V6 |

ML PROGRAMMING CONDITIONS OF NVN CELL OF FIG. 16A

| ACTION | ST. DATA | BIT LINE | SOURCE/ NWELL | READ SEL. L. | PROGRAM | PROGRAM SEL. L. |
|---|---|---|---|---|---|---|
| ERASE | 00 | 0 | 0 | V1 | VTUN | VTUN + VT |
| WRITE | 01 | V2 | V2 | V2 + VT1 | 0 | >VT2 |
| WRITE | 10 | V3 | V3 | V3 + VT1 | 0 | >VT2 |
| WRITE | 11 | V4 | V4 | V4 + VT1 | 0 | >VT2 |

*ML PROGRAMMING CONDITIONS OF NVN CELL OF FIG. 17A*

MEMORY CELL USING HIGH-VT ENHANCED BTBT NMOS FOR BOTH WRITING AND ERASING

| ACTION | ST. DATA | BIT LINE | SOURCE | READ SEL. L. | PWELL | PROGRAM | PROGRAM SEL. L. |
|---|---|---|---|---|---|---|---|
| ERASE | 00 | 0 | 0 | V1 | VTUN | VTUN | VTUN + VT2 |
| WRITE | 01 | V2 | V2 | V2 + VT1 | V1 | 0 | VT2 |
| WRITE | 10 | V3 | V3 | V3 + VT1 | V1 | 0 | VT2 |
| WRITE | 11 | V4 | V4 | V4 + VT1 | V1 | 0 | VT2 |

ML PROGRAMMING CONDITIONS OF NVN CELL OF FIG. 18A

| ACTION | ST. DATA | BIT LINE | SOURCE | READ SEL. L. | NWELL | PWELL | PROG. | PROG. SEL. L. | BIAS |
|---|---|---|---|---|---|---|---|---|---|
| ERASE | 00 | 0 | 0 | 0 | 0 | 0 | 0 | 0 | VTUN |
| WRITE | 01 | 0 | 0 | V1 | 0 | 0 | V1 | >V3 + VT2 | 0 |
| WRITE | 10 | 0 | 0 | V1 | 0 | 0 | V2 | V3 + VT2 | 0 |
| WRITE | 11 | 0 | 0 | V1 | 0 | 0 | V3 | V3 + VT2 | 0 |

*ML PROGRAMMING CONDITIONS OF NVN CELL OF FIG. 19A*

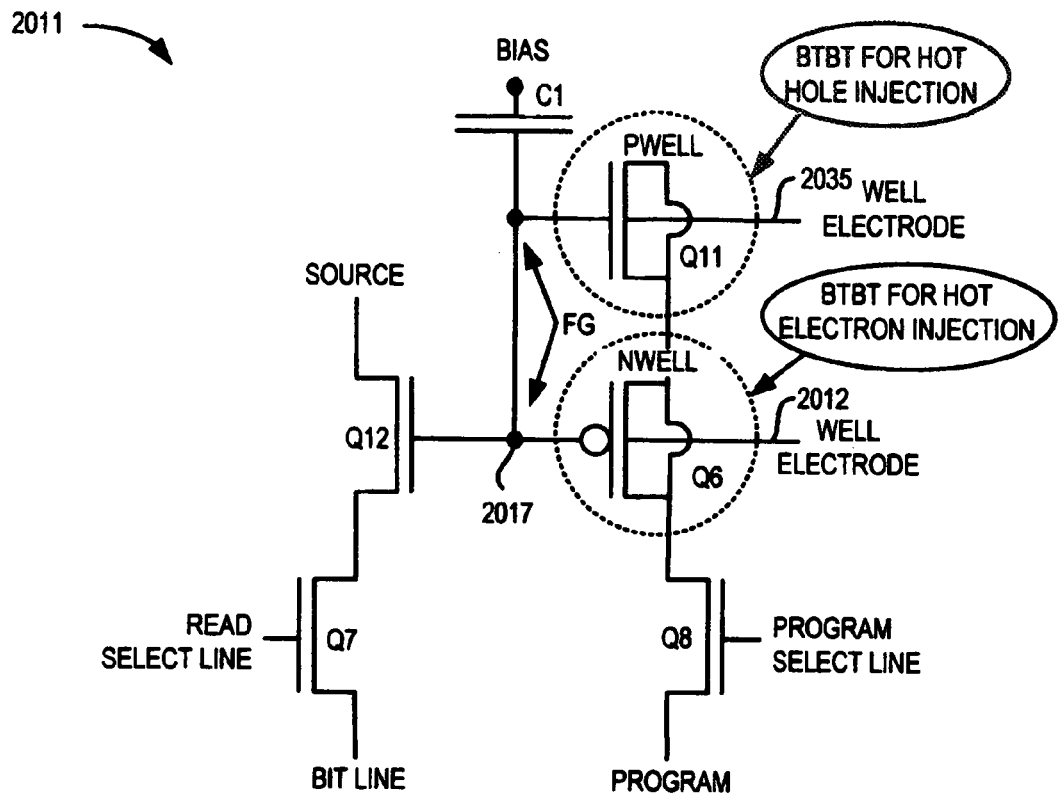
FIG. 20A  MEMORY CELL USING HIGH-VT ENHANCED BTBT PMOS AND NMOS
| ACTION | BIT LINE | SOURCE | READ SEL. L. | NWELL | PWELL | PROGRAM | PROGRAM SEL. L. | CAPACITOR BIAS |
|---|---|---|---|---|---|---|---|---|
| READ | PR.CH. 0 FLOAT | VDD | VDD | 0 | 0 | 0 | 0 | 0 |
| WRITE 00 | 0 | 0 | 0 | 0 | 0 | V2 | 0 | 0 |
| WRITE 01 | V1 | V1 | V1 | V2 | 0 | 0 | V2 | V3 |
| WRITE 10 | V1 | V1 | V1 | V2 | 0 | 0 | V2 | V4 |
| WRITE 11 | V1 | V1 | V1 | V2 | 0 | 0 | V2 | V5 |
FIG. 20B  ML PROGRAMMING CONDITIONS OF NVN CELL OF FIG.20A

NON-VOLATILE MEMORY CELL WITH BTBT PROGRAMMING

RELATED APPLICATIONS

The present application is a continuation of U.S. patent application Ser. No. 12/410,417 filed Mar. 24, 2009, which is incorporated herein by reference.

The U.S. patent application Ser. No. 12/410,417 is a continuation-in-part of the following commonly owned U.S. patent applications.

(1) U.S. patent application Ser. No. 11/601,305 (Nov. 16, 2006) (now U.S. Pat. No. 7,508,719 (Mar. 24, 2009) (hereby incorporated herein by reference) in the name of inventor Andrew E. Horch and entitled "NON-VOLATILE MEMORY CELL CIRCUIT WITH PROGRAMMING THROUGH BAND-TO-BAND TUNNELING AND IMPACT IONIZATION GATE CURRENT." That application, in turn, claims the benefit of priority from U.S. Provisional Patent Application Ser. No. 60/839,771 (Aug. 24, 2006) in the name of the same inventor.

(2) U.S. patent application Ser. No. 12/080,127 (Mar. 31, 2008) (now U.S. Pat. No. 7,652,921 (Jan. 26, 2010) in the name of inventors Andrew E. Horch and Bin Wang and entitled "MULTI-LEVEL NON-VOLATILE MEMORY CELL WITH HIGH-VT ENHANCED BTBT DEVICE." That application, in turn, claims the benefit of priority from U.S. Provisional Patent Application Ser. No. 60/928,762 (May 11, 2007) in the name of the same inventors.

U.S. patent application Ser. No. 11/601,474 (Nov. 16, 2006) (now U.S. Pat. No. 7,474,568 (Jan. 6, 2009) in the name of Andrew E. Horch and entitled "NON VOLATILE MEMORY WITH PROGRAMMING THROUGH BAND-TO-BAND TUNNELING AND IMPACT IONIZATION GATE CURRENT" may be considered pertinent to this disclosure.

TECHNICAL FIELD

The present disclosure relates generally to the field of non-volatile electronic memory and, more specifically, to non-volatile memory programmed by the mechanism of Band-to-Band Tunneling ("BTBT").

BACKGROUND

Memory cells are electronic devices arranged to store electronic signals. A plurality of memory cells can be combined in various arrangements in order to store a number of bits arranged in bytes, words or other combinations. Various electronic circuits including semiconductor devices such as transistors are used to form memory cells. Memory cells are classified as either volatile (data is lost when power is lost) or non-volatile (data is retained even if power is lost).

Demand for embedded non-volatile memory ("NVM") in integrated circuits has recently grown significantly. Such memory is used to store serial number information, security information, settings, parameters, computer instructions (firmware) and the like. Desirable characteristics of embedded NVM include low cost, low power consumption, high speed and high reliability (specifically in terms of data retention and program/erase cycling endurance). NVM may be embedded in various integrated circuit (IC) technologies such as, for example, Complementary Metal Oxide Semiconductor (CMOS) technology. NVM is particularly useful in devices comprising computer processors, signal processors, application specific semiconductors (ASICs) and the like.

Reprogrammable NVM is particularly important to the emerging field of programmable tags, such as RFID (radio frequency identification) tags which store information inexpensively and can be remotely sensed and/or rewritten without the need to complete an actual circuit with the RFID tag itself.

There is an ever-growing need for NVM with higher storage density, lower power consumption and ease of programming.

BRIEF DESCRIPTION OF THE SEVERAL VIEWS OF THE DRAWINGS

This disclosure addresses shortcomings found in the prior art by providing improved NVM useable in, for example, embedded applications.

Overview

Figure 1A:
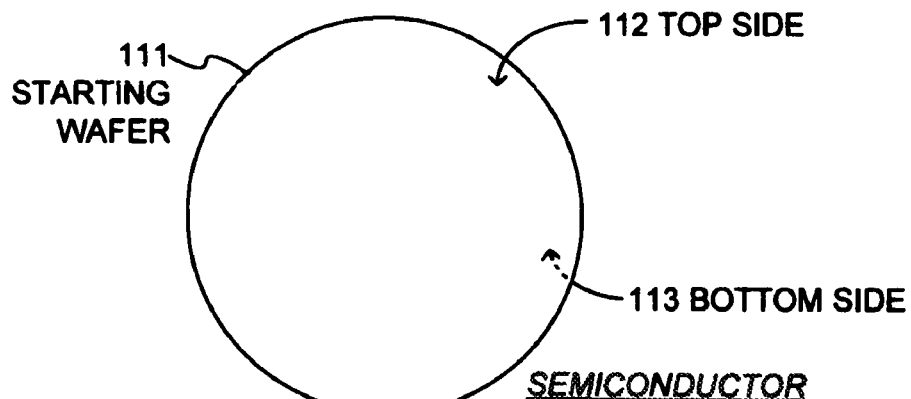

The present disclosure provides a Non-Volatile Memory (NVM) cell and programming method thereof. The cell is capable of denoting at least two distinct logic levels (e.g., 0 and 1). The cell has a read-transistor with a floating gate, and at least a first Band-To-Band Tunneling (BTBT) device sharing the floating gate with the read-transistor. The first BTBT device is configured as an injection device for injecting a first charge onto the floating gate when the first BTBT device is biased with a first gate bias voltage such that the BTBT device is in accumulation, to set at least one of the logic levels. A first electrode is coupled to bias the first BTBT device with a first bias voltage that is higher than the first threshold voltage. The first bias voltage is controlled such that the BTBT device is in accumulation during a write operation. The injected amount of charge on the floating gate is determined by the first bias voltage.

The invention offers numerous advantages over prior solutions. It enhances storage density, has lower power consumption during a write cycle than Impact-ionized Rot Electron Injection (IREI) or Channel Rot Electron Injection (CREI), and makes programming a specific amount of charge on the floating gate (FG) simpler. The programming is simpler since BTBT of a FG is a self-limiting operation; the injected amount of charge on the floating gate is set by biasing conditions largely independent of programming time (only a minimum time is needed, additional time does not significantly affect the charge on the FG). Therefore, programming with BTBT can be done without voltage checking and without iterations of charge-transfer of the FG.

These and other features and advantages of the invention will be better understood from the specification of the invention, which includes the following Detailed Description and accompanying Drawings.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

Figure 1B:
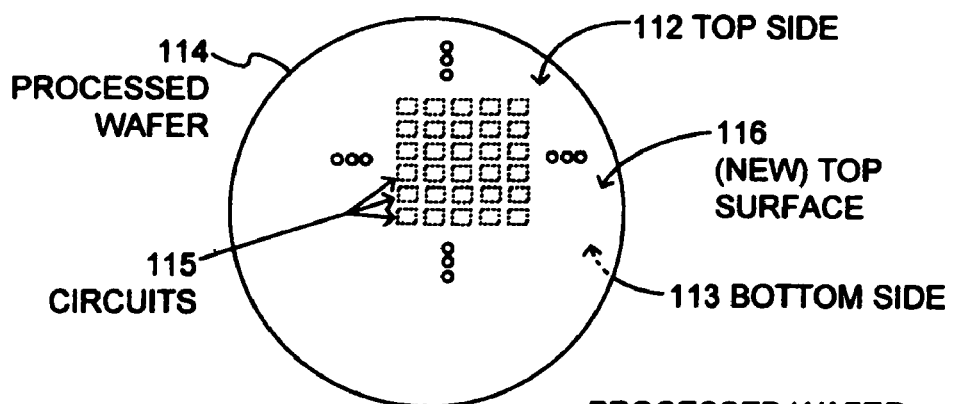
Figure 1C:
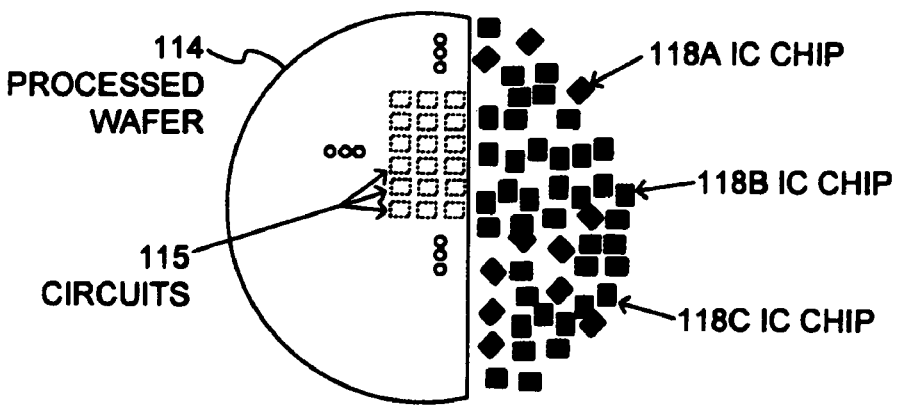

In the drawings:

FIGS. 1A, 1B, and 1C are snapshots of steps in methods for preparing integrated circuit chips from a silicon wafer according to embodiments.

Figure 2:
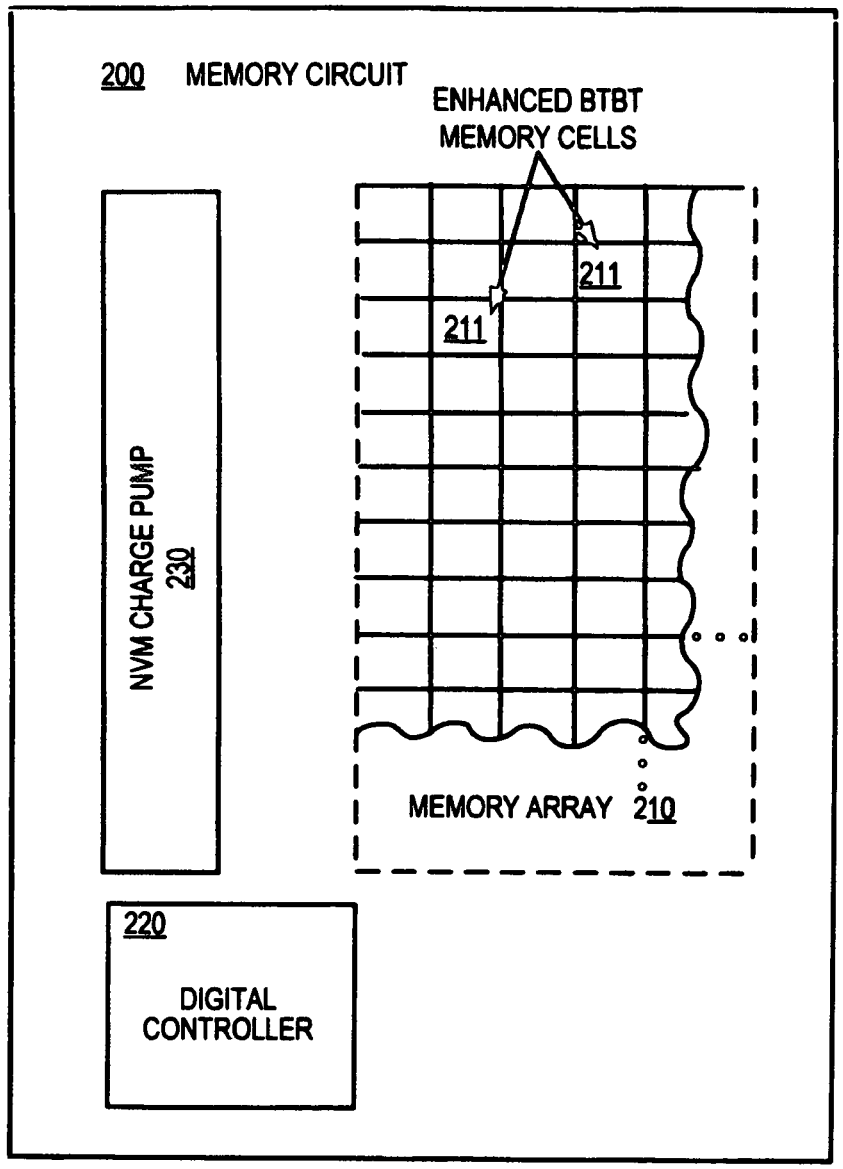

FIG. 2 is a block diagram illustrating an implementation of the memory device according to an embodiment.

Figure 3A:
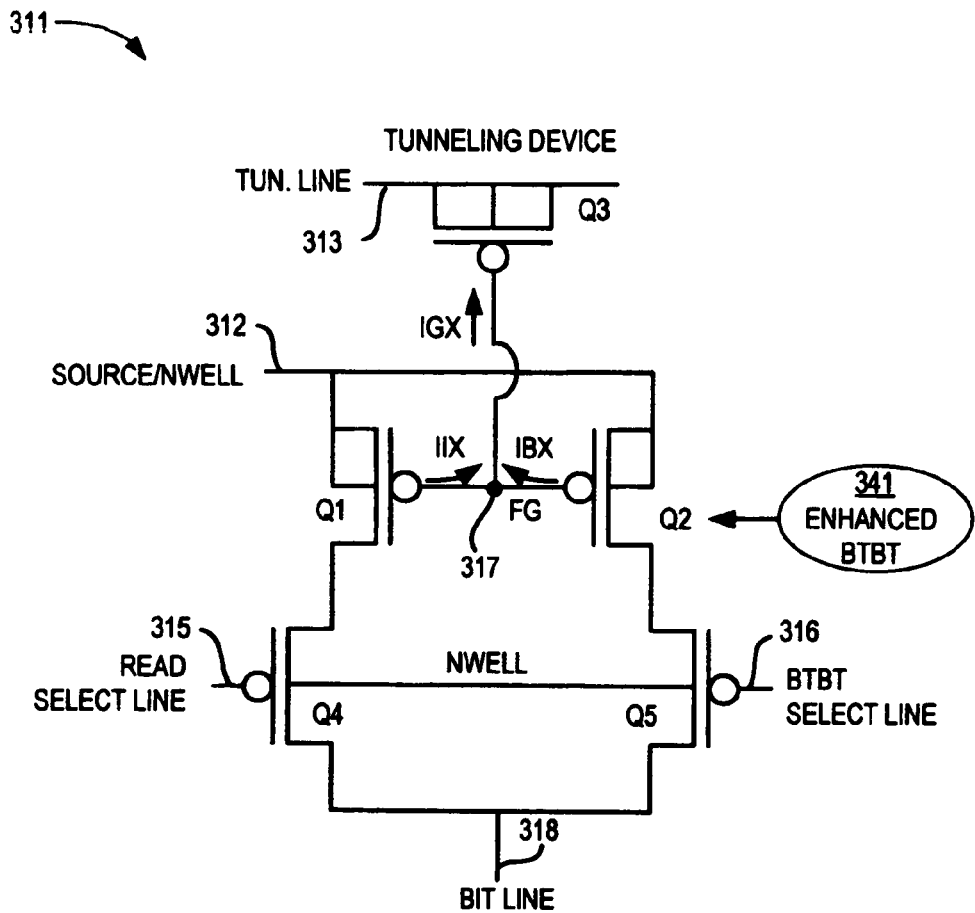

FIG. 3A depicts a non-volatile memory (NVM) cell utilizing a regular enhanced BTBT device.

Figure 3B:
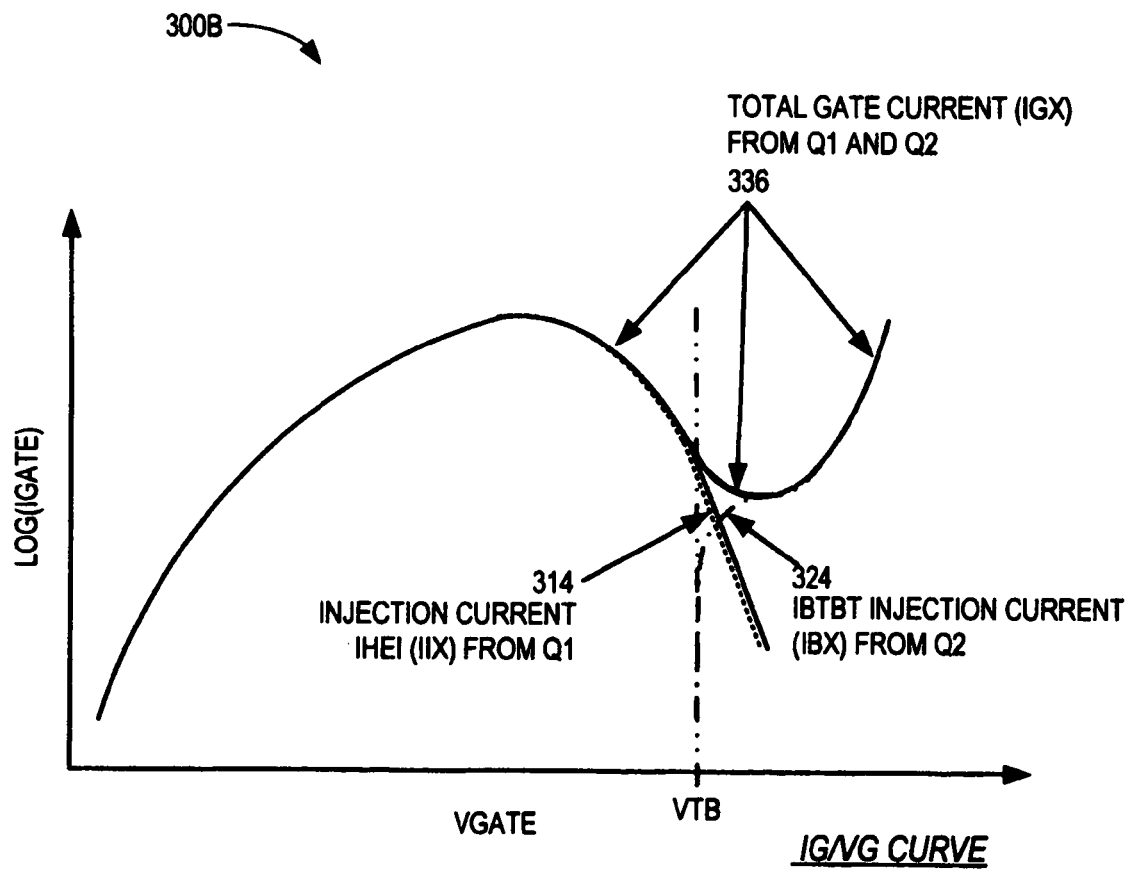

FIG. 3B is a graph showing a gate current of a Floating Gate (FG) of the NVM cell of FIG. 3A that illustrates the contribution to the gate electrode current from both an impact ionization current component and a band-to-band-tunneling current component.

Figure 4A:
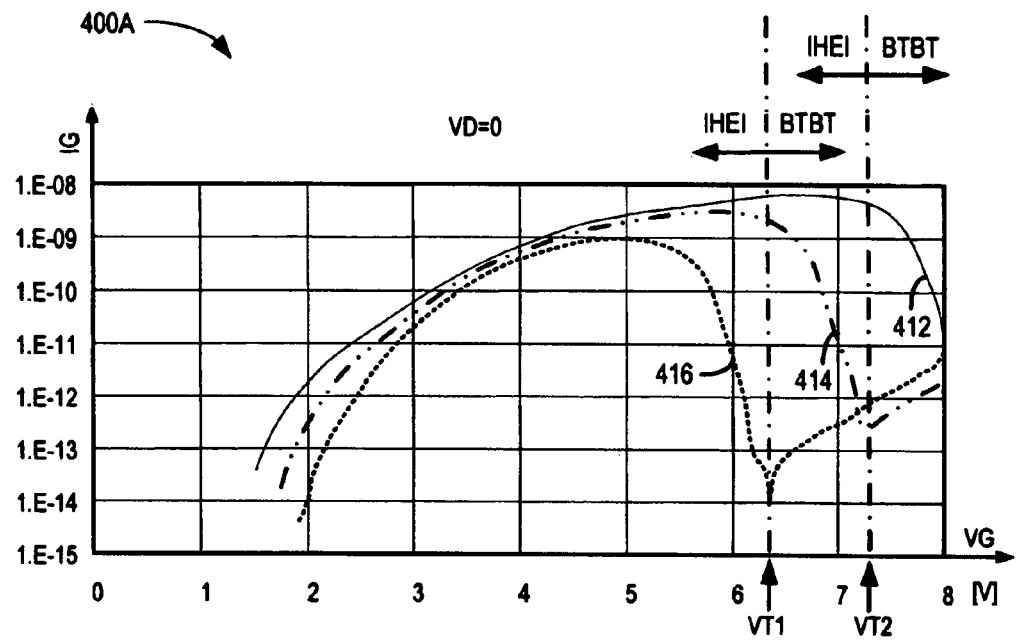

FIG. 4A shows graphs of measured gate currents of an exemplary regular PMOS transistor resulting from impact ionization and BTBT within the transistor's conductive channel.

Figure 4B:
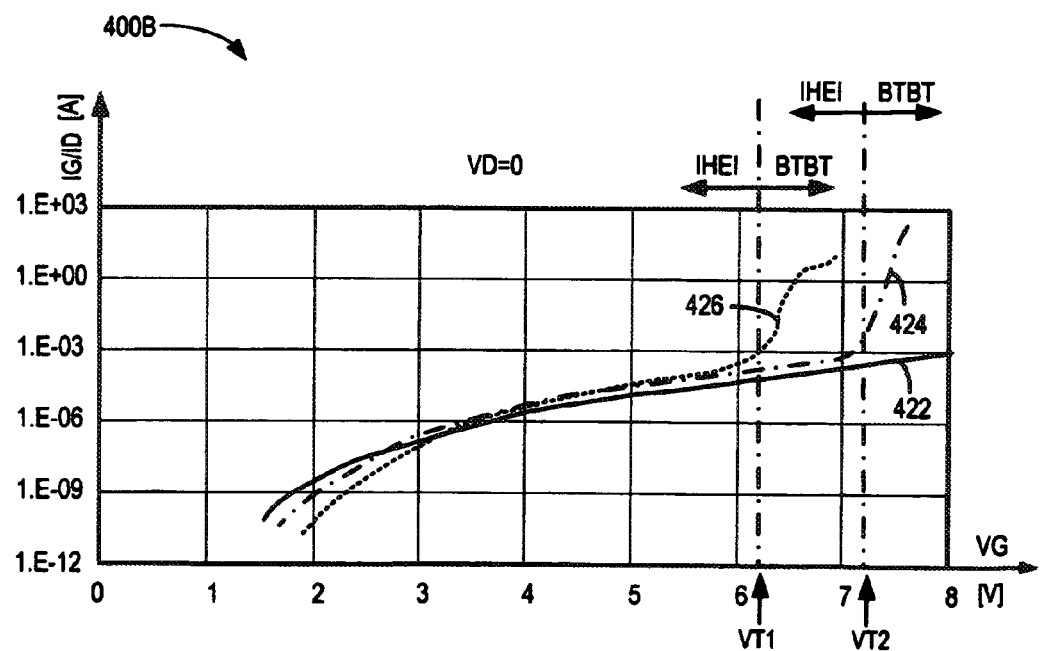

FIG. 4B shows a graph of ratios of measured gate currents versus measured drain currents of the exemplary regular PMOS transistor resulting from impact ionization and BTBT within the transistor's conductive channel.

Figure 5:
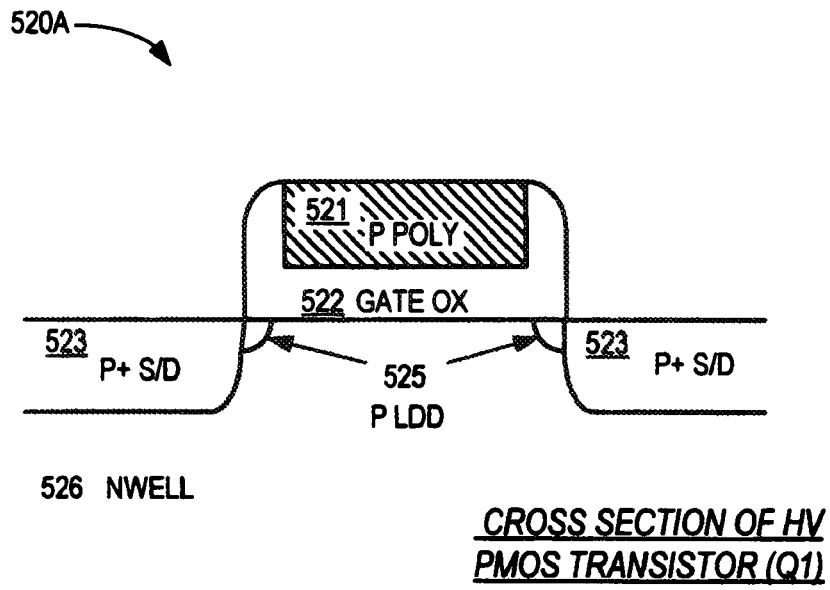

FIG. 5 shows an exemplary cross-section of the high voltage PMOS device QI of FIG. 3A.

Figure 6:
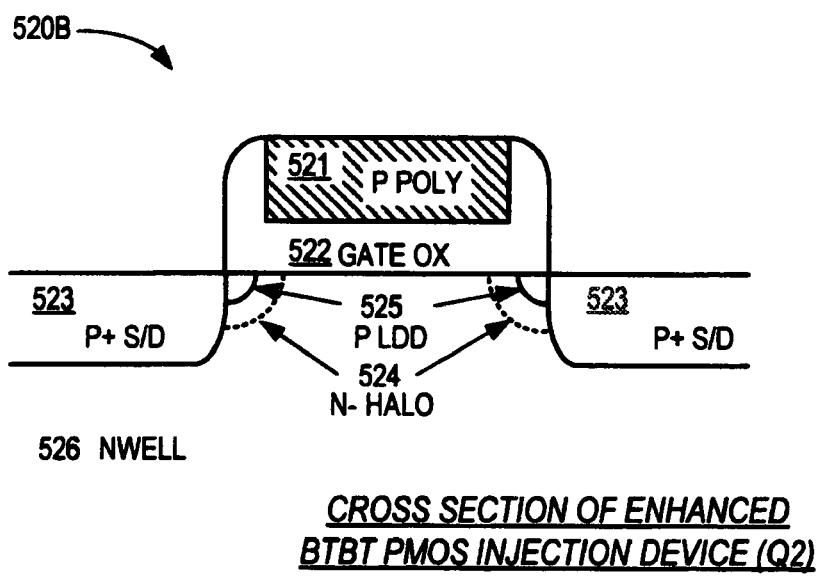

FIG. 6 shows an exemplary cross-section of the regular enhanced PMOS BTBT device Q2 of FIG. 3A.

Figure 7A:
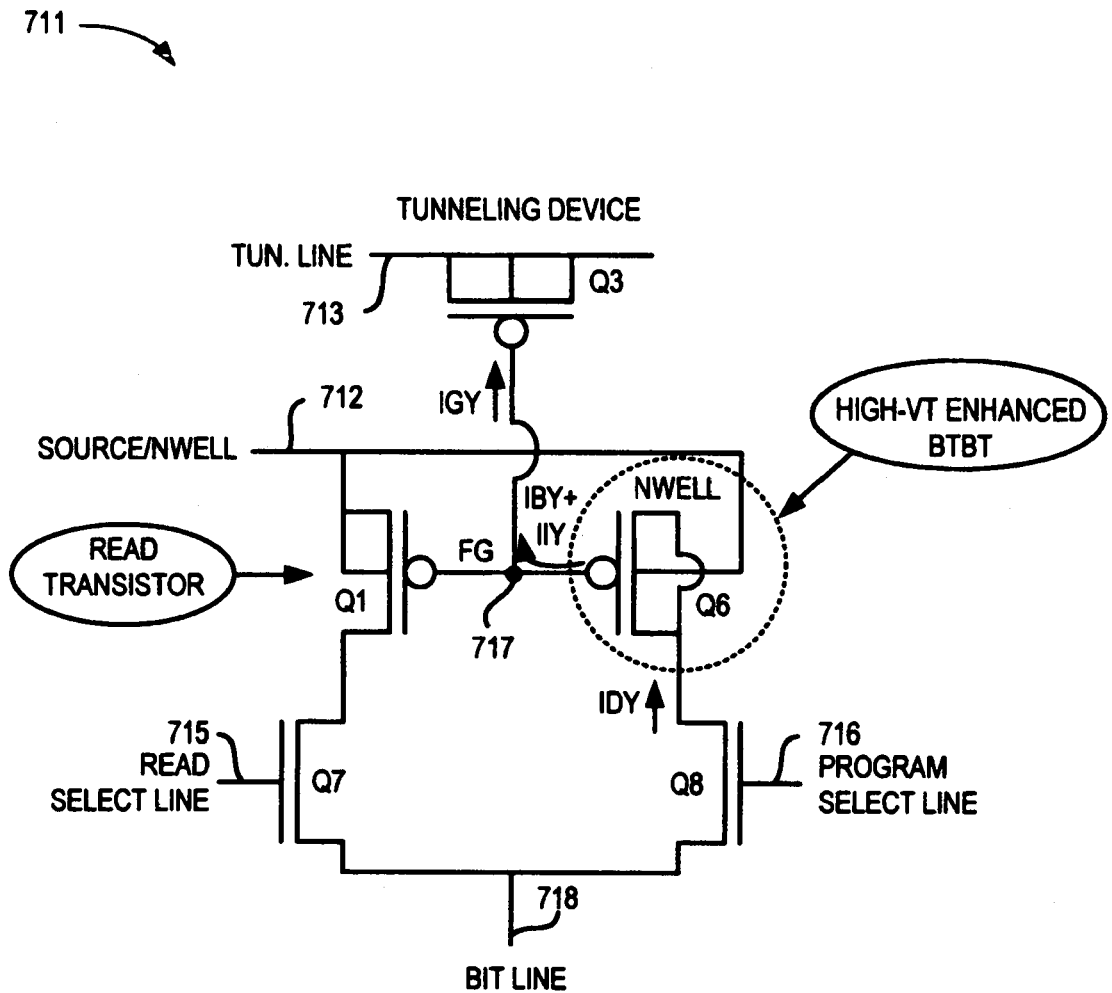

FIG. 7A depicts an NVM circuit utilizing a High Threshold Voltage (High-VT) enhanced BTBT device according to an embodiment.

Figure 7B:
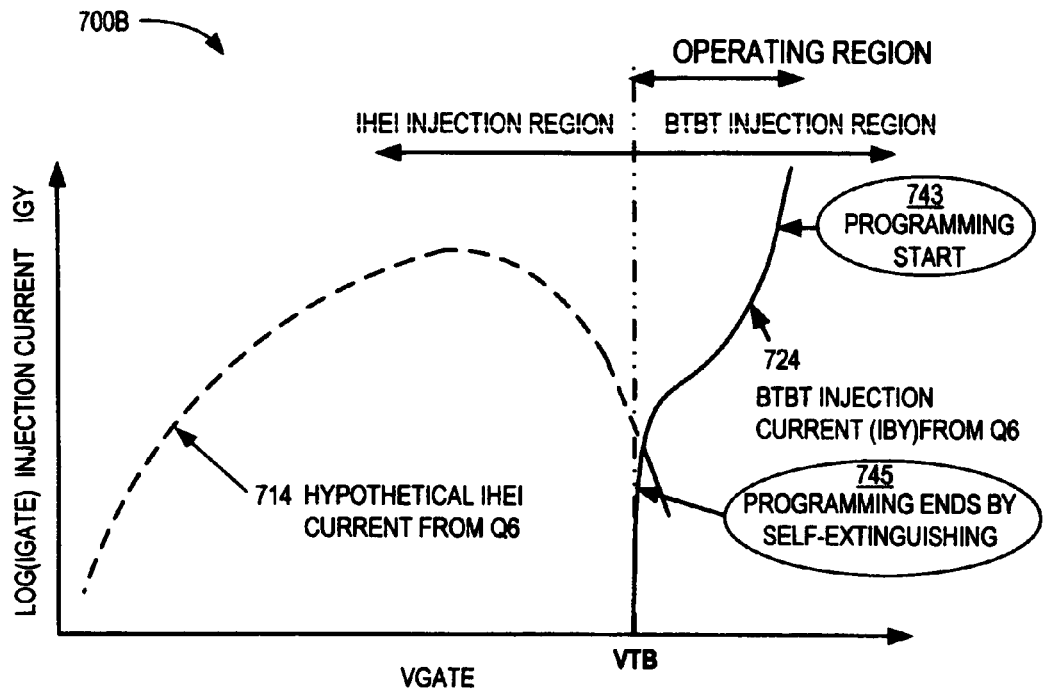

FIG. 7B is a graph showing an operating region for the NVM circuit of FIG. 7A and indicates possible contributions to a gate electrode current from both an impact ionization current component and a band-to-band-tunneling current component from BTBT device Q6.

Figure 7C:
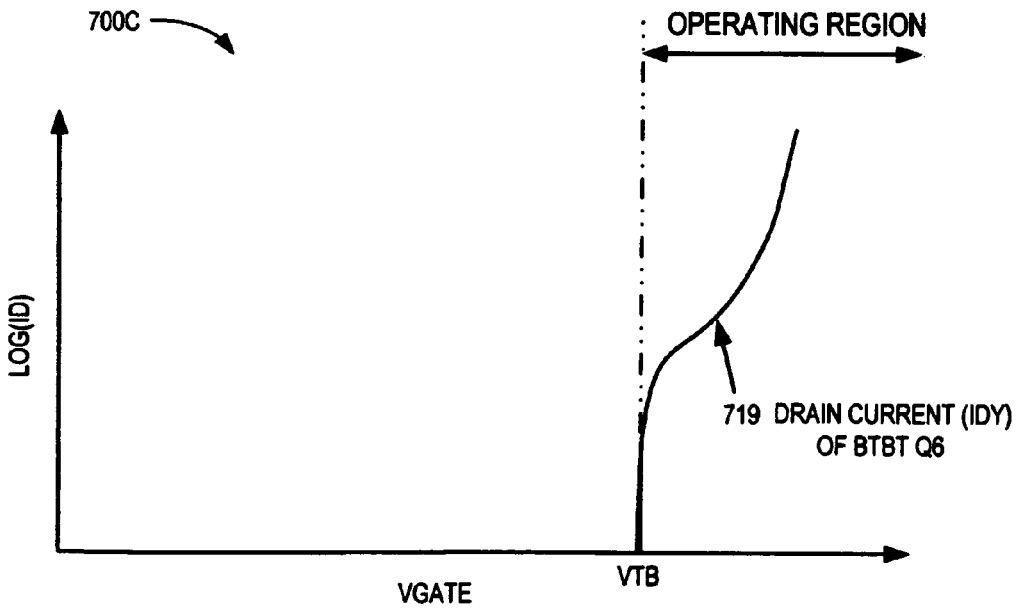

FIG. 7C is a graph showing a drain current of BTBT device Q6 of FIG. SA in the operating region.

Figure 8A:
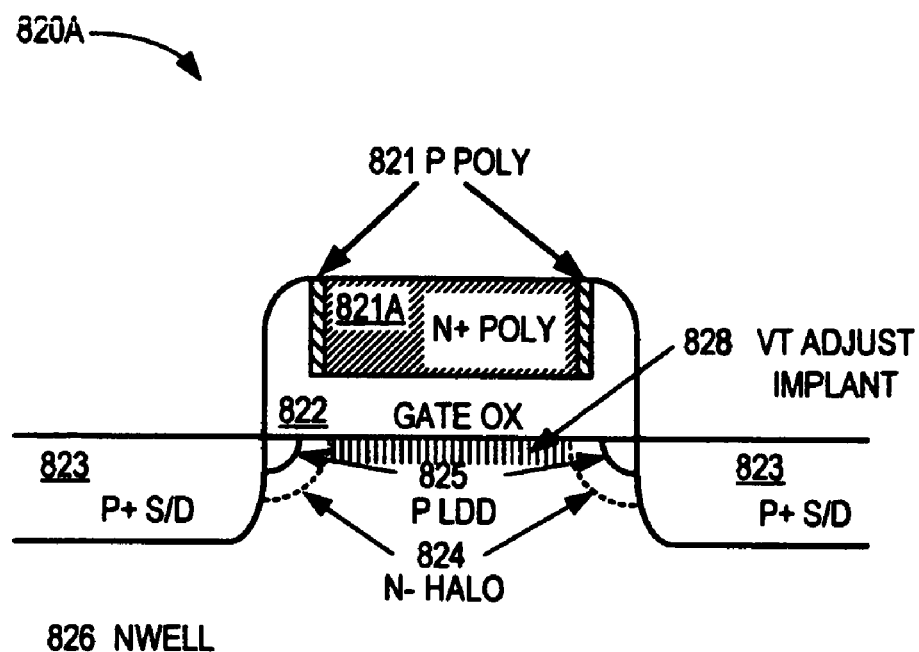

FIG. 8A shows an exemplary cross section of the High-VT enhanced BTBT device Q6 of FIG. 7 A according to an embodiment.

Figure 8B:
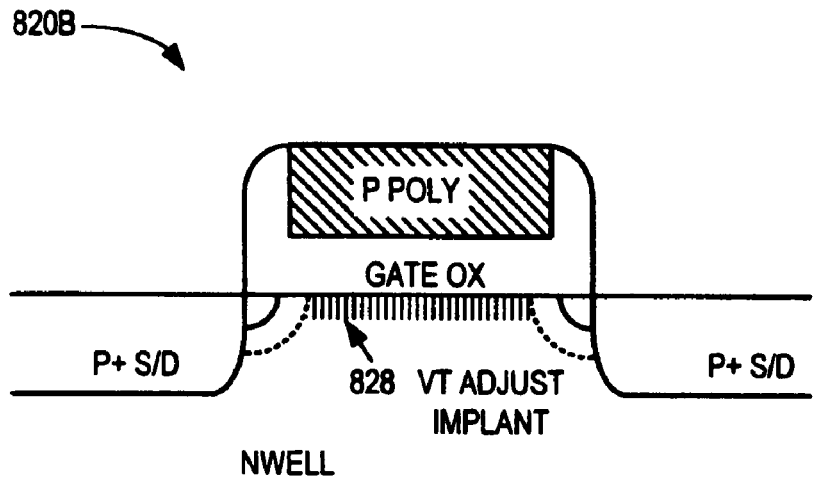

FIG. 8B shows an exemplary cross section of a High-VT enhanced BTBT device with a threshold adjust implant according to an embodiment.

Figure 8C:
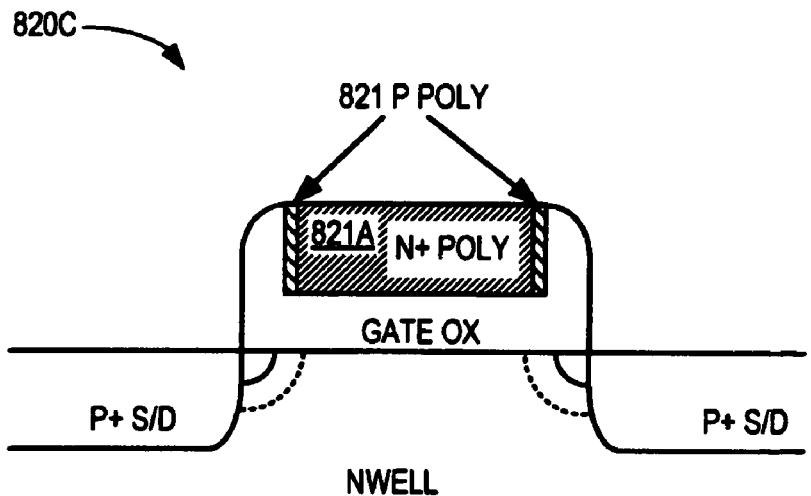

FIG. 8C shows an exemplary cross section of a High-VT enhanced BTBT device with an N+Poly gate according to an embodiment.

Figure 9A:
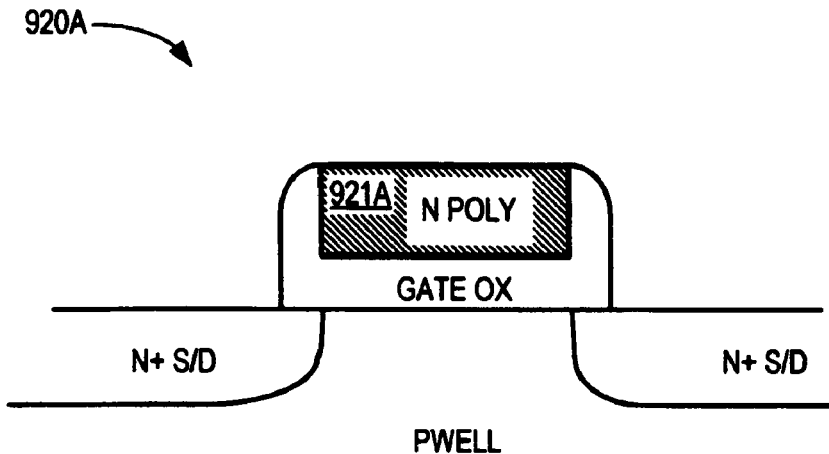

FIG. 9A shows an exemplary cross section of an enhanced BTBT NMOS device with a heavily doped N+ gate without a LDD implant according to an embodiment.

Figure 9B:
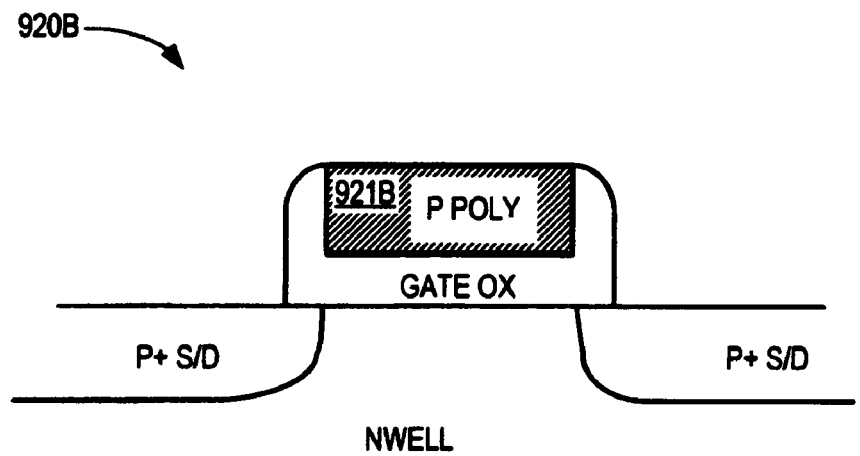

FIG. 9B shows an exemplary cross section of an enhanced BTBT PMOS device with a heavily doped P+ gate without a LDD implant according to an embodiment.

Figure 9C:
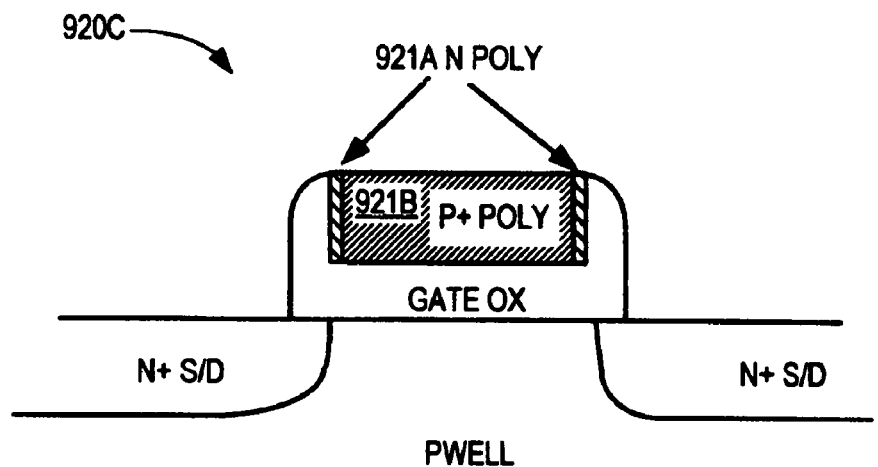

FIG. 9C shows an exemplary cross section of a High-VT enhanced BTBT NMOS device with a heavily doped P+ gate without a LDD implant according to an embodiment.

Figure 9D:
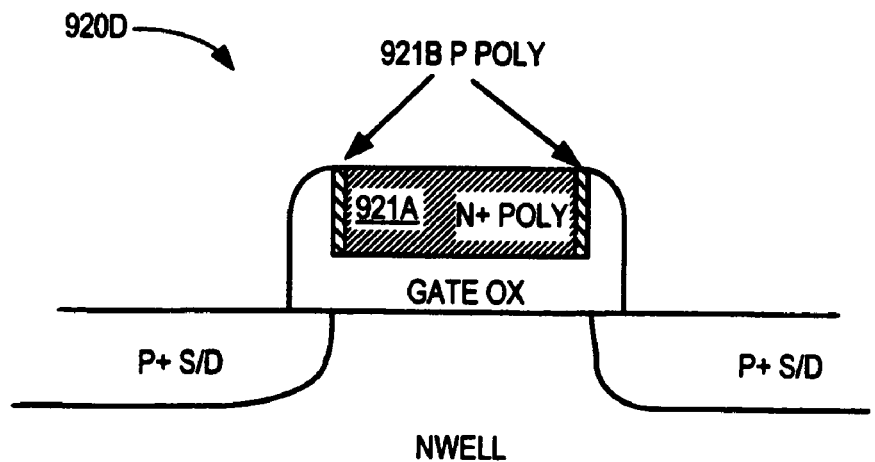

FIG. 9D shows an exemplary cross section of a High-VT enhanced BTBT PMOS device with a heavily doped N+ gate without a LDD implant according to an embodiment.

Figure 10:
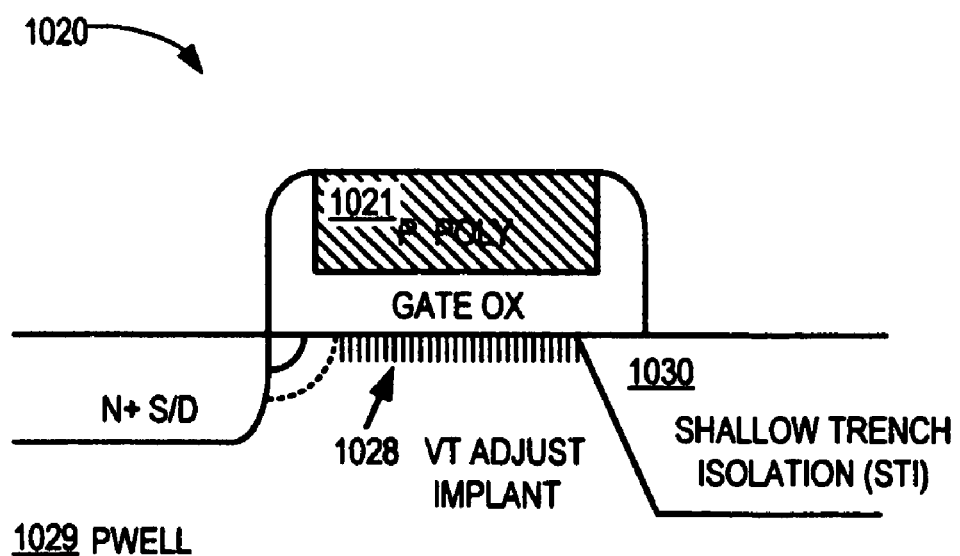

FIG. 10 shows an exemplary cross section of a High-VT enhanced BTBT device
NMOS device without a source implant according to an embodiment.

FIG. 11A shows a table of control voltage levels applied to the NVM cell of FIG. 3A having the regular enhanced BTBT device Q2 during operations.

FIG. 11B shows a table of control voltage levels applied to the NVM cell of FIG. 7A having the High-VT enhanced BTBT device Q6 during operations.

Figure 12A:
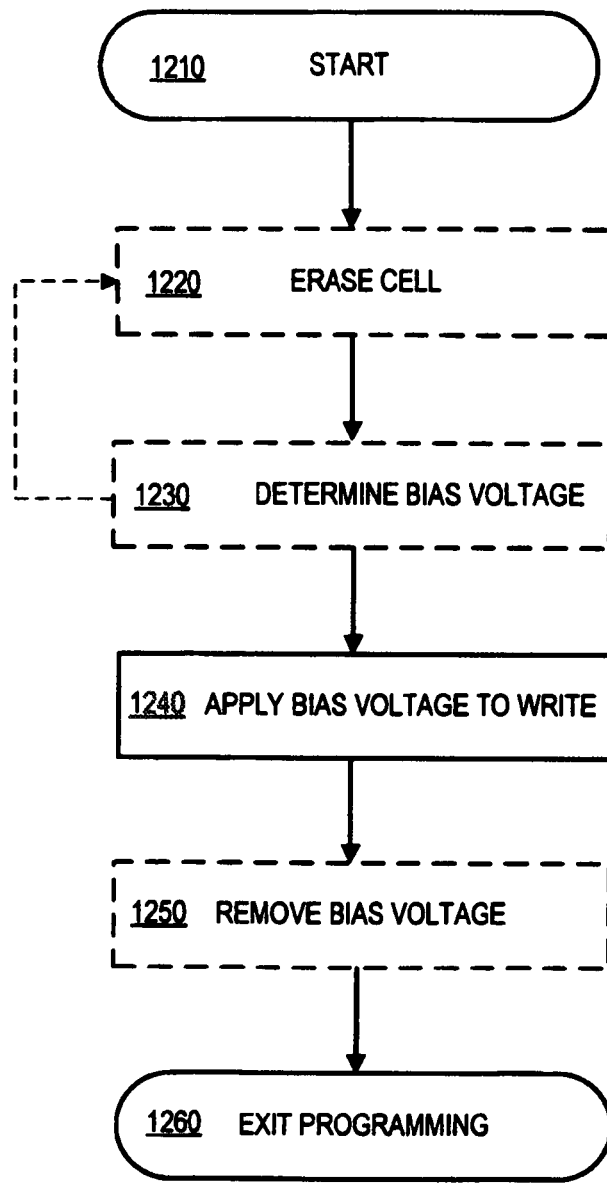

FIG. 12A is a flow chart illustrating a method of programming an NVM cell with the High-VT enhanced BTBT device according to embodiments.

Figure 12B:
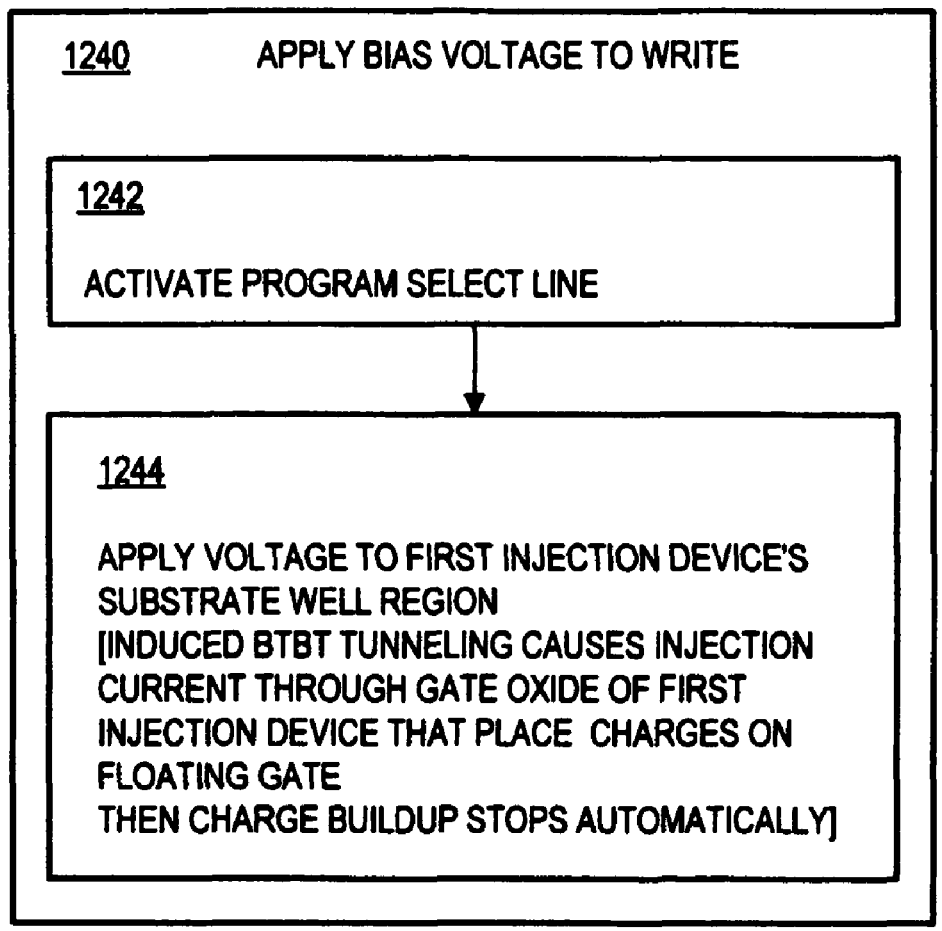

FIG. 12B illustrates a method of writing to a floating gate with the High-VT enhanced BTBT device according to embodiments.

Figure 13:
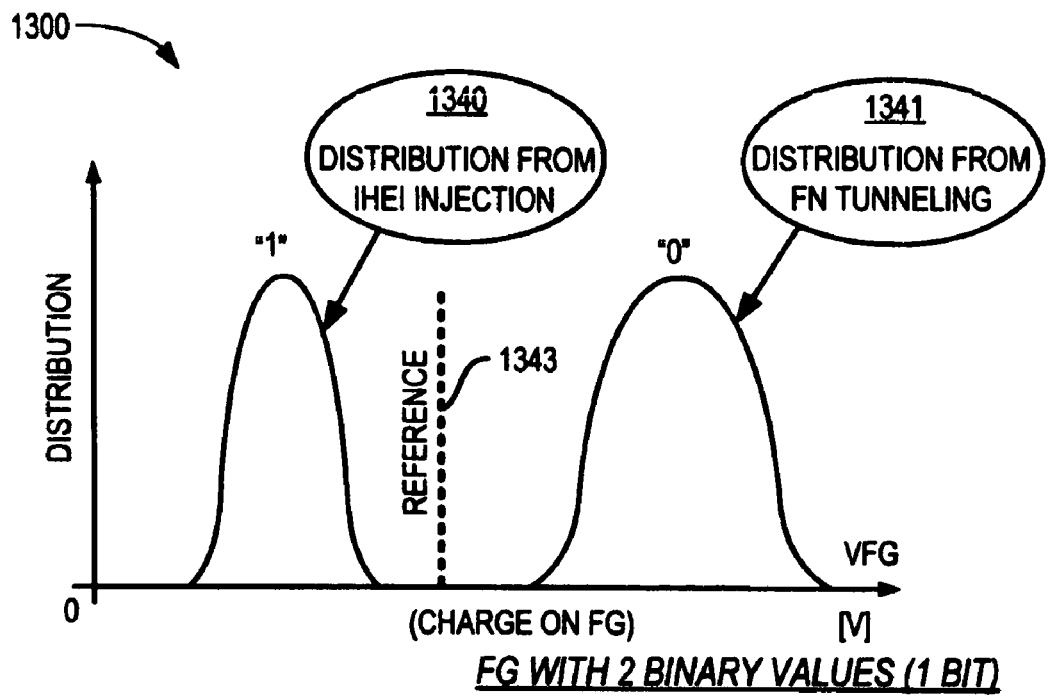

FIG. 13 is a graph showing a charge distribution on a floating gate for binary value according to prior art.

Figure 14A:
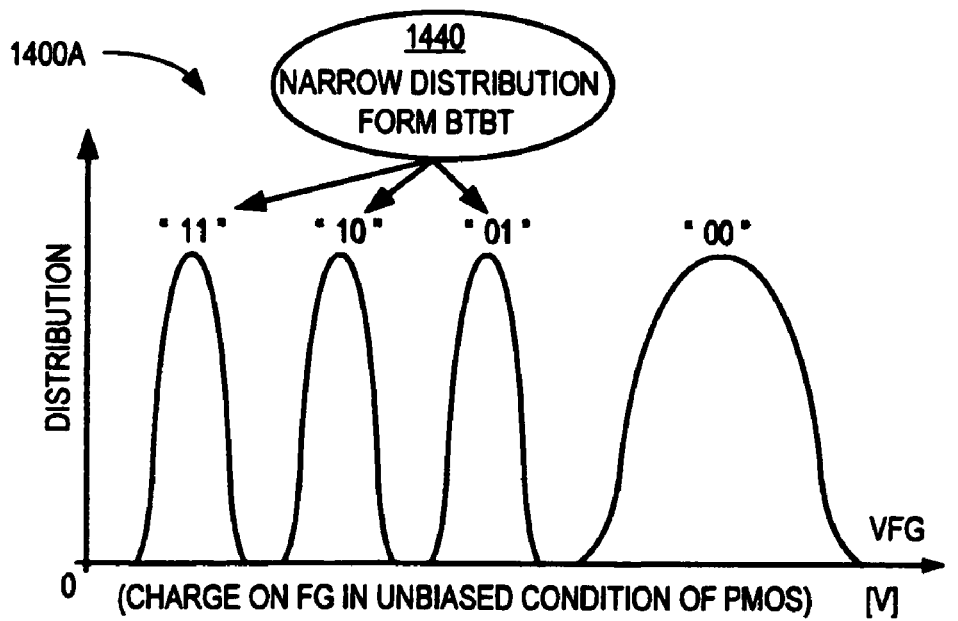

FIG. 14A is a graph showing charge distributions on a floating gate for 2 bits Multi-Level (ML) values according to an embodiment.

Figures 14B, 15:
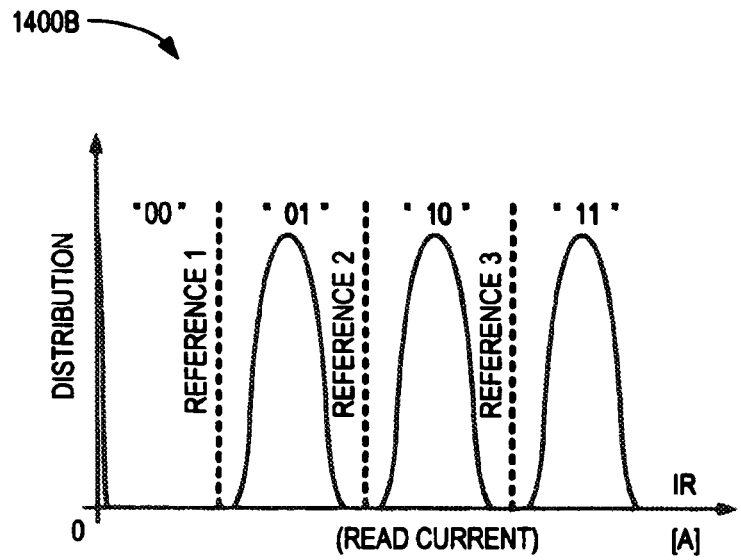

FIG. 14B is a graph showing read current distributions of a 2 bits ML memory according to an embodiment.

FIG. 15 is a table showing ML programming conditions for the NVM cell of FIG. 7 A according to an embodiment.

FIG. 16A is schematic diagram of an NVM cell circuit utilizing a High-VT enhanced PMOS BTBT device for writing according to an embodiment.

Figure 16B:
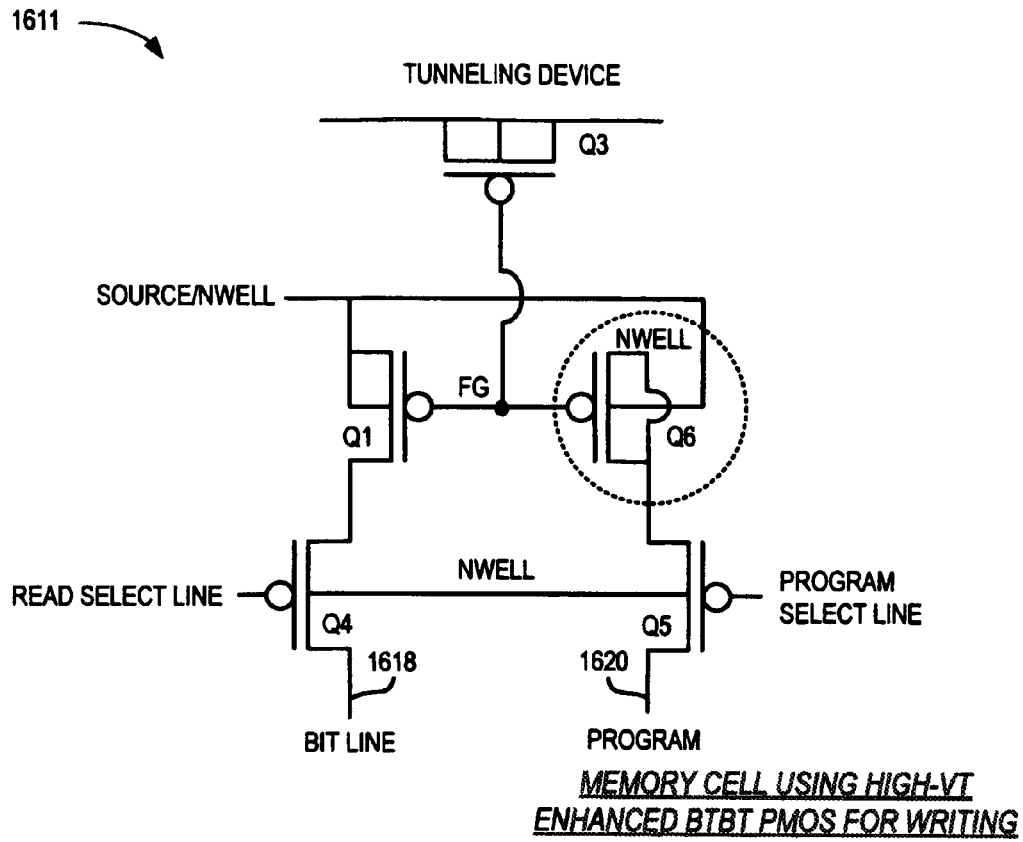

FIG. 16B is a table showing ML programming conditions for the NVM cell of FIG. 16A according to an embodiment.

Figures 17A, 17B:
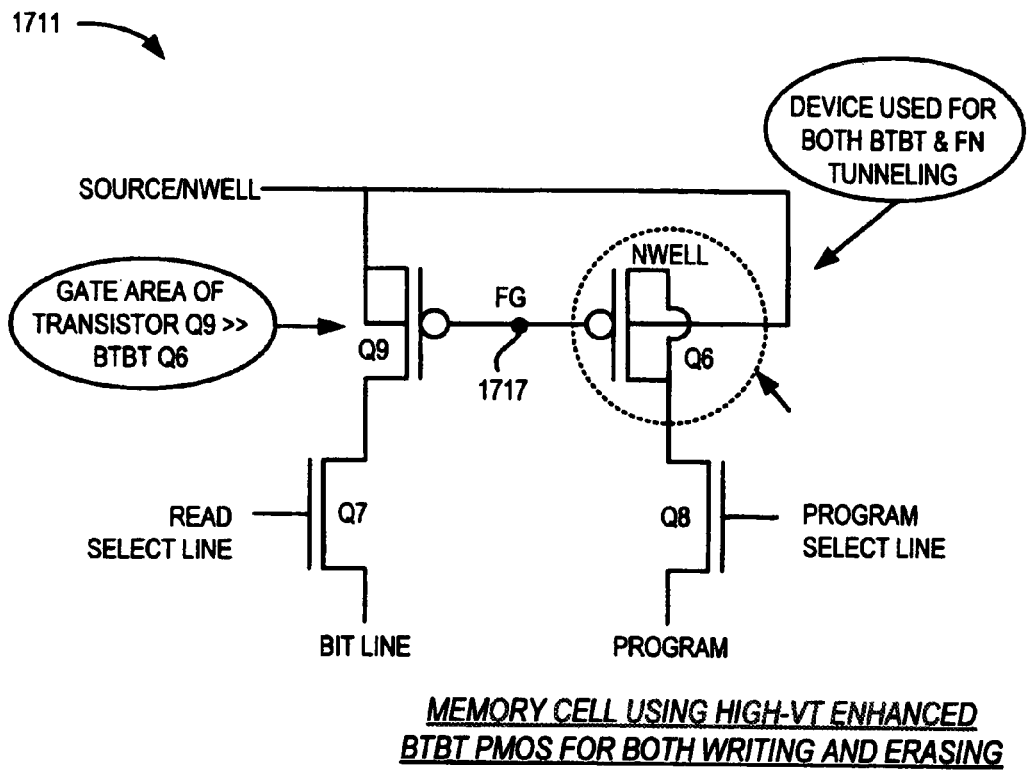

FIG. 17A is schematic diagram of an NVM cell circuit utilizing a High-VT enhanced PMOS BTBT device for both writing and erasing according to an embodiment.

FIG. 17B is a table showing ML programming conditions for the NVM cell of FIG. 17A according to an embodiment.

Figures 18A, 18B:
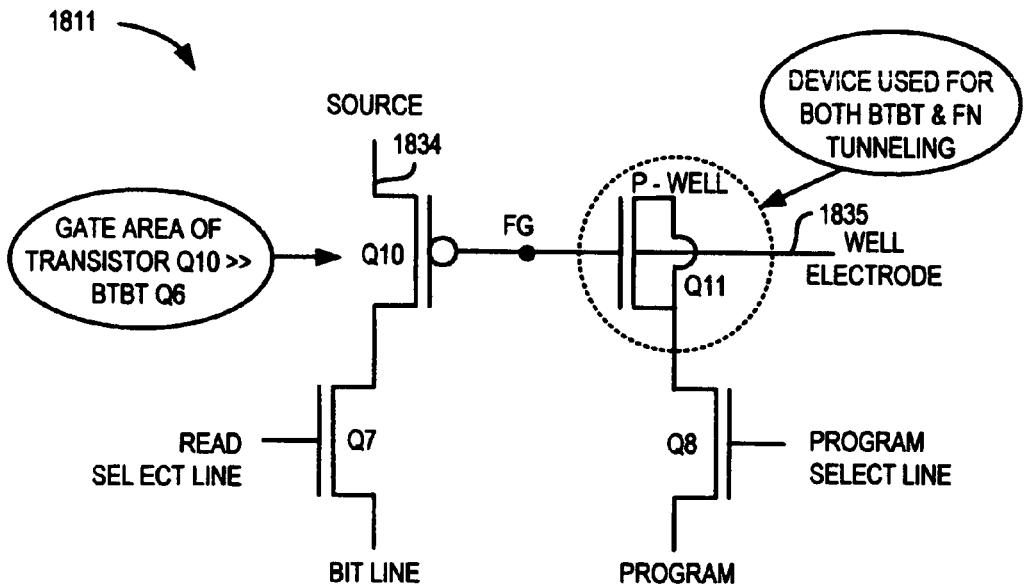

FIG. 18A is schematic diagram of an NVM cell circuit utilizing a High-VT enhanced NMOS BTBT device for both writing and erasing (BTBT and Fowler-Nordheim tunneling) according to an embodiment.

FIG. 18B is a table showing ML programming conditions for the NVM cell of FIG. 18A according to an embodiment.

Figures 19A, 19B:
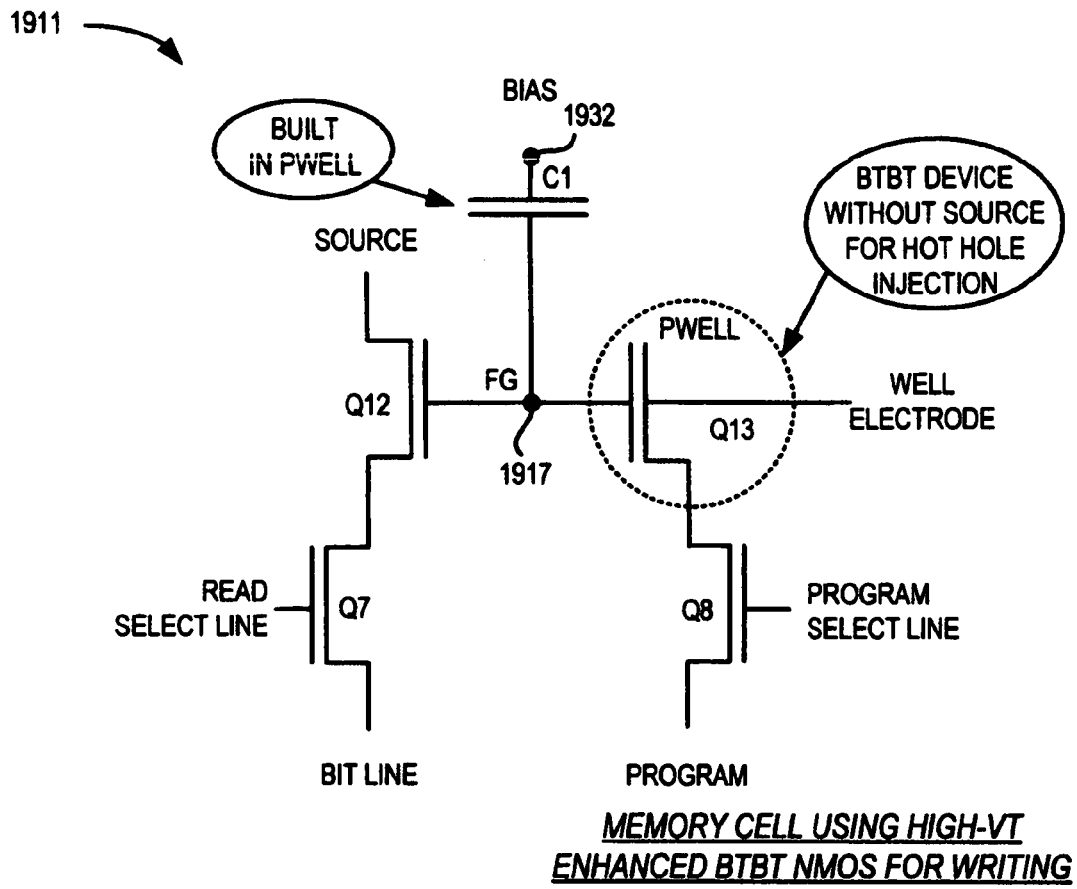

FIG. 19A is schematic diagram of an NVM cell circuit utilizing a High-VT enhanced NMOS BTBT device without source implant for writing according to an embodiment.

FIG. 19B is a table showing ML programming conditions for the NVM cell of FIG. 19A according to an embodiment.

FIG. 20A is schematic diagram of an NVM cell circuit utilizing High-VT enhanced NMOS BTBT and BTBT devices writing according to an embodiment.

FIG. 20B is a table showing ML programming conditions for the NVM cell of FIG. 20A according to an embodiment.

DETAILED DESCRIPTION

Example embodiments are described herein in the context of an electronic nonvolatile memory cell. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

As used herein and understood by those of ordinary skill in the art of semiconductor device physics, the symbol n+ (or N+) indicates an n-doped semiconductor material typically having a doping level of n-type dopants on the order of $10^{20}$ atoms per cubic centimeter or more. The symbol n− (or N−) indicates an n-doped semiconductor material (such a silicon (Si), germanium (Ge), Gallium Arsenide (GaAs), and the like) typically having a doping level on the order of $10^{17}$ atoms per cubic centimeter for n-doped wells and on the order of $10^{15}$ atoms per cubic centimeter for n− substrate material. Similarly, the symbol p+ (or P+) indicates a p-doped semiconductor material typically having a doping level of p-type dopants on the order of $10^{20}$ atoms per cubic centimeter or more. The symbol p− (or P−) indicates a p-doped semiconductor material typically having a doping level on the order of $10^{17}$ atoms per cubic centimeter for p-doped wells and on the order of $10^{15}$ atoms per cubic centimeter for p− substrate material. Those of ordinary skill in the art will now realize that a range of doping concentrations around those described above will also work. Furthermore, the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Essentially, any process capable of forming pFETs and nFETs will work. Doped regions may be diffusions or they may be implanted. When it is said that something is doped at approximately the same level as something else, the doping levels are within a factor often of each other, e.g., $10^{16}$ is within a factor often of both $10^{15}$ and $10^{17}$.

The present invention is now described. While it is disclosed in its preferred form, the various specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention might be modified in numerous ways. Among other things, the present invention may be embodied as devices, methods, and so on. Accordingly, the present invention may take the form of an entirely device embodiment, an entirely method embodiment, or an embodiment combining aspects of the above. This description is therefore, not to be taken in a limiting sense.

As has been mentioned, the present invention provides a Non-Volatile Memory cell and programming method therefore.

The invention is now described in more detail.

FIGS. 1A, 1B, and 1C are snapshots of a very high-level overview of steps in methods for preparing integrated circuit chips from a silicon wafer according to various embodiments.

FIG. 1A shows a starting wafer 111. Wafer 111 is typically of semiconductor material, such as silicon. The silicon is sometimes doped with p-type or n-type impurities, to improve its electronic properties, as desired for it to operate as a substrate. Wafer 111 has a top side 112 and a bottom side 113 opposite top side 112. Typically, circuits are formed on top side 112, as described below.

FIG. 1B shows a processed wafer 114, which has been derived from wafer 111 after circuits 115 have been formed according to embodiments. Only a few such circuits 115 are shown in FIG. 1B, but that is only by way of illustration. In actual practice, as many as possible such circuits 115 are formed on wafer 111, to increase yield per wafer, and thus reduce the cost of each resulting unit.

Circuits 115 are formed by semiconductor manufacturing machines, often operated by foundries. It is worthwhile to note that circuits 114 are formed at the original surface of top side 112, both beneath the level of the original surface and above it. In addition, other materials are then deposited on top side 112.

FIG. 1C shows that wafer 114 of FIG. 1B is afterwards separated into individual chips 118A, 118B, 118C, etc. Each of individual chips 118A, 118B, 118C, typically contains one of circuits 115, and is thus called an integrated circuit (IC) chip.

FIG. 2 is a block diagram that illustrates a possible implementation of memory circuit 200 according to an embodiment. Memory circuit 200 includes memory array 210, digital controller 220, and charge-pump circuit block 230. Memory array 210 commonly comprises a number of cells, e.g., cell 211, which store data to be consumed by operational components. Memory array 210 may be implemented in the form of an NVM array comprising of cells that are addressable in terms of rows and columns. In some embodiments, the NVM memory cell may be constructed using floating-gate MOS transistors. Memory cell 211 stores electrical charge that can represent digital data. An un-programmed memory cell generally has digital datum of "0". To store data other than "0", charge is stored in a floating gate. This operation requires energy from the charge-pump.

Digital controller 220 is arranged to provide the necessary data processing and control signal manipulation capability for write and read operations. It addresses individual cells 211 of memory array 210 during write, e.g., program and erase operations. It should be noted that the words program and write are used interchangeably throughout this document when they refer to a memory cell. It also manages the operation of charge-pump 230 and high voltage switches (not shown) for write/read operations to provide required bias conditions and control signals for the cells.

Charge-pump 230 is an electronic circuit that uses capacitors as energy storage elements to convert low voltages into higher voltage outputs. Charge-pump 230 is an essential component of memory circuit 210 since it provides high voltages for the write operation. Due to design constraint, it is desirable to keep a size of charge-pump 230 small. The disclosed NVM memory cell 211 and the associated method provides a current efficient programming that allows the use of smaller charge-pump than the prior art.

FIG. 3A shows a schematic diagram of Non-Volatile Memory (NVM) cell 311 utilizing a regular enhanced BTBT device. NVM cell 311 includes a PMOS read-transistor Q1 and PMOS Band-To-Band-Tunneling device (BTBT device)

Q2 sharing Floating Gate (FG) 317 with the read-transistor Q1. Coupled to FG 317 is a gate of PMOS tunneling-device Q3.

In operation, in order to program memory NVM cell 311 to a first logic state, transistor Q4 is turned on by selecting line 315, high-energy electrons are added to FG 317 from transistor Q1. To accomplish this, a source/well voltage at electrode 312 is set to a level that causes a substantial VSD voltage drop from the source to the drain of transistor Q1. For example, the voltage at source/well electrode 312 is set to a large positive voltage such as 2*VDD where VDD is a DC supply voltage appropriate for operating logic devices for the expected life of the part, this high voltage creates a large voltage drop across transistor Q1. This large voltage drop corresponds to the establishment of a high intensity electric field running from the source of transistor Q1 to the drain of transistor Q1.

Transistor Q1 is also on, in the sense that the charge level on FG 317 corresponds to a voltage on FG 317 that is sufficiently below a value of VS-VT, where VS is the source voltage of transistor Q1 is set to a value of 2*VDD, and VT is the threshold or turn-on voltage of transistor Q1. When transistor Q1 is sufficiently turned on, a conductive channel is established within the substrate portion of transistor Q1 just beneath its gate dielectric.

In transporting the current within transistor Q1, holes within conductive channel of transistor Q1 flow from source to drain of transistor Q1, and in so doing, are accelerated to very high velocities by the high intensity electric field. These high-energy holes collide with the semiconductor substrate lattice from which transistor Q1 is constructed. The collisions with the lattice create high-energy electrons that have enough energy to surmount an energy barrier of gate dielectric of transistor Q1 and to travel to FG 317 where they are collected. The collection of electrons on FG 317 lowers the charge on the FG below some threshold, which corresponds to a first logic state e.g., a logic "1" or "0".

In order to erase NVM cell 311 and put NVM cell 311 into a second logic state (e.g., a logic "1" or "0"), electrons are removed from FG 317, and that effectively increases the charge on FG 317 beyond a second threshold, which corresponds to the second logic state. During this process, electrons are tunneled by a Fowler-Nordheim (FN) tunneling mechanism from FG 317 into a semiconductor substrate portion of tunneling-device Q3. In case of FN tunneling, a large positive voltage is applied on the Tun. Line 313 to create a strong electric field that runs from the semiconductor substrate portion of tunneling-device Q3 to FG 317. This large positive voltage causes bending an energy band structure of the gate dielectric of tunneling-device Q3 that promotes the tunneling of electrons through the energy barrier that resides between FG 317 and the semiconductor substrate portion of tunneling-device Q3. During FN tunneling, the drain, source, and well of devices Q1 and Q2 are typically held at or near ground (0 V).

The ability to accurately control the logic state being held by NVM cell 311 depends on the ability to control the amount of high energy electrons that are injected onto FG 317 from the substrate portion of transistor Q1 during a program operation and on the ability to accurately control the amount of electrons that tunnel from FG 317 into the substrate portion of tunneling device Q3 during an erase operation. With the ever-decreasing size of transistor dimensions (e.g., in terms of gate length and gate dielectric thickness), however, the ability to control these transport mechanisms is proving to be increasingly difficult. For example, if too many electrons are removed from FG 317 during the erase operation, this will raise the charge level on FG 317 and a corresponding voltage to too high a level to disable transistor Q1, and to adequately supply high energy electrons to FG 317 during a subsequent program operation. However, this difficulty is avoided by using BTBT device Q2, since BTBT device Q2 can supply additional electrons to FG 317. BTBT device Q2, just like transistor Q1, uses FG 317 at its own gate node. BTBT device Q2 injects current into FG 317 by a different physical mechanism than transistor Q1.

Consequently, BTBT device Q2 is capable of injecting electrons onto FG 317 even though transistor Q1 is not, e.g., in the case where a previous erase operation raised the voltage on the FG too high to sufficiently turn on transistor Q1. Device Q2 will inject charge more efficiently with BTBT the more positive the gate charge.

A pair of select transistors Q4 and Q5 is coupled serially with read-transistor Q1 and BTBT device Q2 respectively.

During the program operation, source/well electrode 312 is controlled by a high positive voltage, e.g., 2*VDD, while the drain of Q2 is held at a much lower voltage, such as 0 V. This creates a large electric field across the drain/well junction of device Q2. This strong well-to-drain electric field causes band-to-band tunneling across a PN junction of BTBT device Q2. The electrons tunneling from band to band across the junction can have enough energy to surmount the gate oxide barrier and be injected onto the FG 317. A positive gate voltage on the BTBT device Q2 increases the electric drain/well field near the surface, further increasing BTBT current.

Select lines 315 and 316 are set to GND, to turn on their respective select transistors Q4, and Q5, and permit any current flowing from transistor Q1 and Q2 to flow into bit line 318. Both of the select lines 315 and 316 are driven in part by addressing logic circuitry that identifies this particular cell to be programmed. Bit line 318 is set to GND to provide a potential sink for any current flowing from transistors Q1 and Q2. In an alternate embodiment device Q4 is turned off during programming. In this embodiment programming is done with BTBT only. The BTBT can be further enhanced by bringing the tunnel line 313 to a high voltage. Bringing the tunnel line to a high voltage helps couple the floating gate more positive enhancing BTBT.

During the erase operation, Tun. Line 313 is set to a large positive voltage to induce FN tunneling of electrons into the substrate region of tunneling-device Q3. The source/well electrode 312 and the drains of device Q1 and Q2 are all set to a low voltage. No BTBT or IREI will occur with V(source)=V(well)=V(drain). By making the area (W*L) of devices Q1+Q2 substantially bigger that device Q3 the electric field during FN tunneling will be across device Q3 and not Q1 or Q2. As a result, FN tunneling will only occur on device Q3.

During a read operation, the source/well electrode 312 is set to a positive voltage, between VDD (where VDD is low enough not to cause significant charge transfer to the FG 317) and the FG voltages associated with the logic states. Select line 315 is set low to turn on transistor Q4, but BTBT select line 316 is set high to turn off transistor Q5. If FG 317 is in the first logic state "0", both transistors Q1 and Q2 are on but current can only flow from transistor Q1 and not from BTBT device Q2 into drain node 318 because transistor Q5 is off Transistor Q5 is used to select which row is programmed, device Q4 is off during program to prevent FG 317 from turning on and pulling down the charge pump. Both Q4 and Q5 may be on during read. If FG 317 is in the second logic state "1", transistors Q1 and Q2 are off and no current flows from bit line 318.

FIG. 3B is graph 300B that shows gate current IGX of FG 317 of the NVM cell 311 of FIG. 3A. Graph 300B shows that the total FG node current IGX 336 is the summation of two gate injection currents, Impact Ionization Induced Injection current IIX 314 contributed by transistor Q1 and BTBT induced injection current IBX 324 contributed by BTBT device Q2. BTBT device Q2 injects electrons onto FG 317 by way of BTBT induced injection. Injection current IBX 324 is different from the Impact Ionization Induced Injection current IIX 314 from transistor Q1. Curve 324 shows increasing gate current with an increase in gate voltage from BTBT device Q2. Thus BTBT device Q2 effectively compensates for a diminishing of injection current IIX from transistor Q1. Contribution of BTBT device Q2 to the total gate current IGX assures sufficient electron flow into FG 317 over a wider span of operating regions.

FIG. 4A shows graph 400A, measured gate currents of an exemplary regular PMOS transistor resulting from impact-ionized hot electron injection when a conductive inversion channel exists and BTBT across the drain/well junction when the channel region is in accumulation. During the measurement, VD was held at 0 V. Graph 400A shows gate current (IG) as a function of gate voltage VG for a regular 3.3 V PMOS transistor manufactured in a standard logic process at a major foundry using a 90 nm process node. Plots 412, 414, and 416 show gate currents while drain voltage (VD) is zero V, source/substrate voltages are 8.5 V, 7.5 V, and 6.5 V respectively. Note the different contributions to a gate current by the different injection mechanisms, i.e., IREI and BTBT injection. At VG higher than VTB BTBT injection dominates, while at VG lower than VTB there is only IREI injection.

FIG. 4B shows graph 400B, ratios of measured gate currents (IG) versus measured drain currents (ID) of the exemplary regular PMOS transistor resulting from impact ionization and BTBT within a conductive channel of the transistor. Plots 422, 424, and 426 show ratios of gate-currents versus drain-currents using the same measurement data as used in FIG. 4A. Note the differences in injection efficiencies as measured by these ratios. When BTBT injection exists, i.e., regions where VG is larger than a particular VT, the BTBT injection is a thousand times more efficient than IHEI. The obtained measurement results suggest that using BTBT as a main injection mechanism can lower ID requirements of the NVM cell, consequently allowing the use of a much smaller charge pump.

FIG. 5 shows exemplary cross-section 520A, of the PMOS device Q1, while FIG. 6 shows exemplary cross-section 520B of the regular enhanced PMOS BTBT device Q2 of FIG. 3A, FIGS. 5, and 6 show how BTBT device Q2 may be made to have more dopant atoms than transistor Q1. BTBT device Q2 has more features in its dopant profile than transistor Q1. Both transistors Q1 and Q2 are shown to have P+doped source/drain 523, and lightly doped drain (P LDD) implants 525. However, BTBT device Q2 has a higher density of a P dopant concentration of approximately $10^{20}$ atoms/cm$^3$ versus $10^{19}$ atoms/cm$^3$ for transistor Q1. BTBT device Q2 has halos 524 with an N− dopant concentration of $10^{18}$ atoms/cm$^3$; however, transistor Q1 does not. The described differences make BTBT device Q2 an efficient injection device.

According to an embodiment, NVM cell 311 of FIG. 3 is constructed from "I/O" transistors, which are different from core logic transistors (not shown) of the semiconductor die (chip) in which the NVM cell 311 is constructed. Transistors Q1 and Q2 have thicker gate dielectrics 522, approximately 70 Å, a typical value for a 3.3V device, than the core logic transistors, which have gate dielectrics thickness of approximately 20 Å, a typical value for a 1.2V device. NVM cells are constructed from these "I/O" transistors because high voltages are used at source/well 312 electrode and at Tun. Line 313 to induce the respective high-energy electron injection and FN tunneling mechanisms. The thicker gate oxide is used to increase floating gate NVM retention.

The rest of the features are the same for both transistors Q1 and BTBT device Q2. They are built in N-Well 526 with a dopant concentration of $10^{17}$ atoms/cm$^3$ and have a dopant concentration of approximately $10^{20}$ atoms/cm$^3$ (p+) for source drain region 523. Transistor Q1 and BTBT device Q2 employs similar P Poly gates 521.

FIG. 7A shows a schematic diagram of Non-Volatile Memory (NVM) cell 711 that utilizes a High Threshold Voltage (High-VT) enhanced BTBT device according to an embodiment. NVM cell 711 shows many structural and operational similarities to that of NVM cell 311 of FIG. 3A with three very notable differences.

BTBT device Q6 is a High-VT BTBT device while BTBT device Q2 of cell 311 is a regular enhanced BTBT device. Differences between a High-VT BTBT device and a regular enhanced BTBT device are described below.

BTBT device Q6 is configured to inject charge onto the floating gate using band-to-band tunneling induced current IBY only. It is incapable of transporting currents by IHEI because its drain and source nodes are configured to be at the same electrical potential. It should be noted that if potentials are high enough, FN tunneling can occur (this requires Vg to be much higher that Vd).

Transistor Q1, although it shares FG 717 with BTBT device Q6, does not provide any charge flow to FG 717 because transistor Q7 is in accumulation during program operation. By preventing transistor Q1 from influencing a charge level on FG 717 and by using BTBT as the sole means of charge control allows a finer control over the charge level on FG 717.

Finer control of the charge level also makes it possible to use NVM cell 711 as a multi-level (ML) storage device. Further discussion on the implementation of a multi-level storage device in this context is provided below.

A pair of select transistors Q7 and Q8 is coupled serially with read-transistor Q1 and BTBT device Q6 respectively. Transistor Q7 provides current (when enabled) to read-transistor Q1. Transistor Q8 provides current (when enabled) to BTBT device Q6.

During a program operation, a high voltage, a voltage high enough to cause BTBT when gate voltage Vg>VT and drain voltage Vd is close to 0 V is applied to electrode 712 to bias the BTBT device and trigger BTBT in device Q6. Program select line 716 is set high to turn on transistor Q8 during the program operation only while BIT line 718 is pulled to or close to 0 V. The applied voltage creates a high intensity electric field, which severely bends an energy band in the N-Well of BTBT device Q6 that results in BTBT in a drain/IN-Well diode. Due to the influence of the high intensity electric field, electrons in the valence band tunnel into the conduction band and the holes left behind travel to the drain. Here electrons are accelerated toward the channel region by a lateral field, and may gain enough energy to travel across a SiO2 barrier to FG 717. Thus, in this manner, BTBT device Q6 injects high-energy electrons onto FG 717. The injected amount of charge (i.e., electrons) on FG 717 is determined by the bias voltage. During the programming operation, the bias voltage is controlled such that the BTBT device is in accumulation. BTBT stops as soon as a channel is formed and there is no longer a reversed bias diode junction.

BTBT device Q6 is designed to have a high intensity electric field beneath and near the edges of its gate, due to the presence of a high density of acceptor atoms near its drain regions. The high density of acceptor atoms results in the flux lines of high intensity electric field flux in BTBT device Q6 terminating close to the surface of the substrate beneath the gate dielectric. This results in severe energy band bending in the drain regions of BTBT device Q6 toward the gate inducing a substantial BTBT within the drain regions of device Q6. It should be noted that BTBT device Q6 is in accumulation during BTBT tunneling. No conductive channel is formed in the source of BTBT device Q6 because the voltage on FG 717 is too high with respect to the voltage of the source. During a read operation program select line 716 may be held low to turn off transistor Q8, thereby preventing BTBT device Q6 from injecting any BTBT current onto floating gate 717 (which would disturb the read operation). Meanwhile read select line 715 is held high to turn on transistor Q7, which provides a current path to read-transistor Q1.

During an unselected program operation, where a different FG that shares the same BIT line 718 is being programmed, program select line 716 is held low to turn off transistor Q8 and shield BTBT device Q6 from having a high electric field between its well and drain. As such, program select line 716 may be driven by 10 gic circuitry that indicates whether the memory cell is selected and it is in a read mode or in some other state. FG 717 that shares common source/nwell 712 can be selectively program by having different BIT line 718 voltages. To inject electrons onto the FG 717 BIT line 718 is held at 0 V. To avoid injecting elections on the FG 717 the bit line is held at a higher voltage, e.g., between 0 V and a voltage on source/nwell electrode 712.

In order to erase NVM cell 711 and put it into logic state "0" or "00", electrons are removed from FG 717. That effectively increases the charge on FG 717 beyond a charge threshold, which corresponds to the desired logic state. During this process, electrons are tunneled by a FN tunneling mechanism from FG 717 into a semiconductor substrate portion of tunneling-device Q3. In case of FN tunneling, a large positive voltage is applied onto Tun. Line 713 to create a strong electric field that runs from the semiconductor substrate portion of tunneling-device Q3 to FG 717. This large positive voltage causes the bending of the energy band structure of the gate dielectric of tunneling-device Q3 that promotes the tunneling of electrons through the energy barrier between FG 717 and the semiconductor substrate portion of tunneling-device Q3. To aid in creating the high voltage across device Q3, the other device are held at a low voltage of about 0 V.

FIG. 7B is graph 700B that shows an operating region of NVM circuit 711 of FIG. 7A and indicates possible contributions to gate electrode current IGY from both IHEI current component IIY 714 and BTBT current component IBY 724 from BTBT device Q6. Graph 700B is divided in two regions along a horizontal axis at a value of VTB, which is the threshold voltage of BTBT device Q6. They are a BTBT injection region right of VTB and an IHEI region left of VTB. NVM cell 711 operates in the BTBT region, where charge is moved onto FG 717 by BTBT current IBY 724. Programming starts at a gate voltage level indicated by note 743. Programming stops when IBY self extinguishes when VG becomes equal to VTB as indicated by note 745.

The IHEI region includes a hypothetical injection current IIY 714. IHEI current IIY 714 cannot develop within the present cell configuration because drain and source nodes of BTBT device Q6 are shorted together and they cannot provide or sink any source-to-drain or drain-to-source currents.

FIG. 7C is graph 700C that shows drain current IDY 719 of device Q6 of FIG. 7A. In the operating region, drain current IDY 719 has the same value as injection current IBY 724.

FIG. 8A shows cross-section 820A of the High-VT enhanced BTBT device Q6 of FIG. 7A according to an embodiment. BTBT device Q6 shares many features with BTBT device Q2 of FIG. 3A and FIG. 6. In addition to the shared features, BTBT device Q6 has some additional features, which raise its VT by at least 300 mV. Having its VT 300 mV higher than a VT of read-transistor Q1 makes device Q6 well suited for BTBT programming. These features include VT adjust implant 828 and N+ doped poly gate 821A. It should be noted, a small part 821 of the gate of BTBT device Q6 is still doped with P-type impurities. Optionally, LDD implant 825 can be skipped if the P+S/D implant 823 overlaps the gate, as this may increase the gradient of the field.

FIG. 8B shows cross-section 820B of High-VT enhanced BTBT device Q6 according to an embodiment. In this embodiment, only threshold-adjust implant 828 is implemented as a High-VT enhancement feature.

FIG. 8C shows cross-section 820C of High-VT enhanced BTBT device Q6 according to an embodiment. In this embodiment, only N+ doped poly gate is implemented as a High-VT enhancement feature.

FIG. 9A shows cross-section 920A of an enhanced BTBT NMOS device according to an embodiment. In this embodiment only heavily doped N poly gate 921A is implemented as a High-VT enhancement feature.

FIG. 9B shows cross-section 920B of an enhanced BTBT PMOS device according to an embodiment. In this embodiment only heavily doped P poly gate 921B is implemented as a High-VT enhancement feature.

FIG. 9C shows cross-section 920C of a High-VT enhanced BTBT NMOS device according to an embodiment. In this embodiment only heavily doped P poly gate 921B is implemented as a High-VT enhancement feature.

FIG. 9D shows cross-section 920D of a High-VT enhanced BTBT PMOS device according to an embodiment. In this embodiment only heavily doped N poly gate 921A is implemented as a High-VT enhancement feature.

FIG. 10 shows cross-section 1020 of a High-VT enhanced NMOS BTBT device Q13 of FIG. 19A according to an embodiment. BTBT device is built in a P-Well 1029. In the embodiment VT adjust implant 1028 and P doped poly gate 1021 are implemented as High-VT enhancement features.

BTBT device Q13 is without a source implant but has shallow trench isolation plug 1030 in its place. This feature prevents IHEI from occurring on this device.

It is noteworthy, that BTBT devices discussed in relation to FIGS. 8A through 10 can also be implemented with devices of a complementary doping polarity.

FIG. 11A shows table 1150A of control voltage levels that are applied to the NVM cell 311 of FIG. 3A during operations. Where VDD_L stands for a supply voltage of the core logic, with a value at 1.2 V for a typical 90 nm process node, and VDD_IO stands for a supply voltage of the I/O circuits, with a value of 3.3 V. The value of VDD_L changes with various technology nodes (i.e., 65 nm vs. 0.18 urn) and process options. Some technology nodes have two other process options. For example, at 65 nm node there can be lower power option with VDD_L=1.2 V and a high performance option with VDD L=0.9 V. Similarly, the VDD_IO may have different options; it may be possible to choose between 2.5 V, 3.3 V, or 5 V I/O devices. To make the examples more general, some of the voltage levels are referenced to VDD_L and VDD IO.

FIG. 11B shows table 1150B of control voltage levels that are applied to the NVM cell 711 of FIG. 7A during operations. VTUN stands for a tunneling voltage with a value between 9-12 V for a typical 3.3 V device. It should be noted that the specific voltages given in relationship with FIGS. 11A and 11B are representative values for a "130 nm" CMOS technology.

FIG. 12A is a flow chart that illustrates method 1200 of programming a PMOS NVM cell with the High-VT enhanced BTBT device according to embodiments.

At operation 1210, programming starts.

At optional next operation 1220, the NVM cell is erased. It should be noted, if the FG has previously be programmed with a state more negative than the desired state an erase operation is needed, the erasing operation uses FN tunneling for removing charge from the FG. This operation is needed since BTBT injection in general only adds charge onto the FG.

At optional next operation 1230, it is determined what bias voltages should be applied to charge the FG to a required level. For example in a multiple level programming scheme where charge can be moved onto and removed from the FG by BTBT injection the temporal charge level of FG is required to complete a write operation. When it is determined that charge needs to be removed from the FG the method may loop back to operation 1220.

Next, at operation 1240, bias voltages are applied to the NVM cell in order to perform the write operation. More detail of this operation is provided below.

At optional next operation 1250, at completion of the write operation, bias voltages are removed from the NVM cell.

At operation 1260, the programming is complete.

FIG. 12B illustrates a method 1240 of writing onto a floating gate with a High-VT enhanced BTBT device according to embodiments.

At operation 1242, program select line is activated to provide a current path to control the drain of the BTBT device.

At operation 1244, a bias voltage is applied to the well region of the BTBT device via source/nwell electrode, the bias voltage is higher than a potential difference between the FG and the well region of the BTBT device. The potential difference is chosen that it remains large enough to keep the BTBT device in accumulation. The applied voltage induces BTBT that causes a flow of injection current through gate oxide of the BTBT device creating a charge buildup on the FG. The charge build-up is a self-extinguishing process in that it stops automatically when a depletion region is formed in the BTBT device. There is no need to check the voltage on the FG. The amount of charge injected on the FG is set by biasing conditions and it is substantially independent of a duration of an application of the bias voltage. There is no need for iterations of charge-transfer to and from the FG.

FIG. 13 is graph 1300 that shows a charge distribution on a FG for binary value according to the prior art. Graph 1300 shows charge distribution as a function of a FG voltage. Graph 1300 represents a scenario where logic "0" is represented by an absence of electrons on the FG, while logic "1" is represented by a presence of electrons on the FG. Stating it differently, FG voltage smaller than that indicated by Reference 1343 represents logic "1", and FG voltage larger than indicated by Reference 1343 represents logic "0". Graph 1300 further demonstrates the influence of injection methods on the shape of charge distributions. The shape of a charge distribution 1340 from IHEI is narrower than the shape of a charge distribution 1341 of FN tunneling.

FIG. 14A is graph 1400A that shows charge distributions on the FG for a 2 bit, ML NVM cell according to an embodiment. Graph 1400 shows charge distribution as a function of voltage on the FG. Graph 1400 represents a scenario where the FG of an NVM cell is part of a PMOS device. The NVM cell can denote four logic values. Logic "0" is represented by the absence of electrons on the FG, while logic "01", "10" and "11" are represented by ever increasing amounts of electrons on the FG. Graph 1400 further demonstrates the influence of injection methods on the shape of charge distributions. Shapes of charge distributions 1440 from BTBT are noticeably narrower than the shape of a charge distribution from FN tunneling. Narrower charge distribution is one of the factors that allow the NVM cell to denote multiple logic values. By precisely controlling the widths of the charge distributions, the NVM cell can denote eight or more logic values.

FIG. 14B is graph 1400B that shows and example of read current distributions of a 2 bit ML NVM cell according to an embodiment. Graph 1400B shows how different read current values are interpreted by a sense amplifier of a ML NVM memory device. Current values below Reference1 are interpreted as logic values "00", currents between Reference1 and Reference2 as logic "01", currents between Reference2 and Reference3 as logic "10", and currents above Reference3 as logic "11". In logic state "00", the FG is hard off, in logic state "01" the FG is slightly on, in logic state "10" the FG is on, and in logic state "11" the FG is hard-on.

FIG. 15 is table 1550 that shows ML programming conditions for the NVM cell of FIG. 7A according to an embodiment. The first column of table 1550 shows the nature of the operations during programming, the second column indicates the logic value equivalent of the stored charge on the FG 717 of FIG. 7A, while the rest of the columns show the values of the applied control signals. V1 through V7 represent ever-increasing voltage levels. Actual voltage levels are a function of the particular process technology used to build the NVM cell. It should be noted that programming can only progress from a lower logic value to a higher one. For instance, logic "11" can be written in an NVM cell which holds charge that represents logic "10", however to write logic "01" the cell needs to be erased first. The above mentioned programming order does not mean that more than one write operation is needed to go from the lowest logic value to the highest.

FIG. 16A shows a schematic diagram of NVM cell 1611 according to an embodiment. NVM cell 1611 operates similarly to NVM cell 711. The two cells are also structurally similar with two notable differences. NVM cell 1611 employs PMOS transistors Q4 and Q5 whereas NMOS transistors Q7 and Q8 are used in NVM cell 711. Furthermore, Bit line 1618 is now separated from the program line 1620.

FIG. 16B is table 1650 that shows ML programming conditions for NVM cell 1611 according to an embodiment. Interpretations of data are the same as in table 1550.

FIG. 17A shows a schematic diagram of NVM cell 1711 according to an embodiment. NVM cell 1711 is a modified version of NVM cell 1611. The two cells are structurally similar with two notable differences. NVM cell 1711 does not have a tunneling device like tunneling-device Q3. Furthermore, a gate area of read device Q9 is much larger than a gate area of BTBT device Q6. The difference operationally between the two cells is due to the lack of the tunneling device in NVM cell 1711. Here BTBT device Q6 is now used for both writing onto, and removing charge from FG 1717.

FIG. 17B is table 1750 that shows ML programming conditions for NVM cell 1711 according to an embodiment. Interpretations of data are the same as in table 1550. In addition, VT1 and VT2 here represent threshold voltages of transistor Q7 and Q8 respectively.

FIG. 18A shows a schematic diagram of NVM cell 1811 according to an embodiment. NVM cell 1811 is a modified version of NVM cell 1711. The two cells are structurally similar with two notable differences. BTBT device Q1 is an NMOS device while BTBT device Q6 of NVM cell 1711 is a PMOS device. Furthermore, source 1834 of read-transistor Q10 and well electrode 1835 of BTBT device Q6 no longer are connected to each other. Operationally the two cells are similar.

FIG. 18B is table 1850 that shows ML programming conditions for NVM cell 1811 according to an embodiment. Interpretations of data are the same as of table 1750.

FIG. 19A shows a schematic diagram of NVM cell 1911 utilizing a High-VT enhanced NMOS BTBT device Q13 without source region according to an embodiment. Device Q13 is fabricated in a similar fashion to the device shown in FIG. 10. NVM cell 1911 can be considered a modified version of NVM cell 1811. The two cells are similar structurally with three notable differences. BTBT device Q13 does not have a source region. The gate area size of the read-transistor is now similar to the gate area size of BTBT device Q13. Furthermore bias capacitor C1, which is built in an N-Well, is coupled to FG 1917. Operational behavior of the two cells are similar with one exception, the voltage level on FG 1917 can be adjusted by the application of a bias voltage at node 1932 to bias-capacitor C1 during the write operation.

FIG. 19B is table 1950 that shows ML programming conditions for NVM cell 1911 according to an embodiment. Interpretations of data are the same as of table 1750.

FIG. 20A is a schematic diagram of an NVM cell circuit utilizing High-VT enhanced NMOS BTBT and BTBT PMOS devices according to an embodiment.

FIG. 20A shows a schematic diagram of NVM cell 2011 utilizing a pair of complementary High-VT enhanced BTBT devices, PMOS BTBT device Q6 and NMOS BTBT device Q11 according to an embodiment. NVM cell 2011 is a modified version of NVM cell 1911. The two cells are similar structurally with one notable differences NVM cell 2011 has BTBT devices, while NVM cell 1911 has only one. BTBT device Q6 and BTBT device Q11 share FG 2017, and they are coupled serially. As an option, the two devices can be coupled in parallel. Each of the BTBT devices has its own separate well electrode. Well electrode 2012 biases the BTBT device Q6 to trigger BTBT in device Q6. Well electrode 2035 biases the BTBT device Q11 to trigger BTBT in device Q11. Program select line 716 is set high to turn on transistor Q8 during the program operation. Operational behaviors of the two cells are similar, with one exception. In this case, BTBT device Q6 is only used to inject hot electrons, while BTBT device Q11 is only used to inject hot holes. Using two BTBT devices, charge levels corresponding to any of the valid distinct logic levels can be written onto FG 2017. It should be noted that device Q12 is used to read the contents of the floating gate. Device Q12 is needed since the enhanced BTBT devices may have VT's too high to allow the contents of the floating gate to be determined at a desired voltage in the desired time frame. The desired read voltage is the voltage that the standard logic normally operates at (typical logic device operation conditions/life).

FIG. 20B is table 2050 that shows ML possible operating conditions for NVM cell 2011 according to an embodiment. Interpretations of data are the same as of table 1950 with one exception. The programming sequence described in relationship to FIG. 15 need not be observed, since charge can be moved onto and removed from FG 2017 in any order. It should also be noted that table 2050 also describes control conditions for a read operation according to an embodiment.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and sub combinations of features, functions, elements, and/or properties may be presented in this or a related document.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A non-volatile memory (NVM) cell, comprising:
a floating gate configured to store charge;
at least one Band-To-Band-Tunneling (BTBT) device coupled to the floating gate and having a first node, the BTBT device adding charge to the floating gate through BTBT;
a read transistor coupled to the floating gate and having at least a second node;
a read select switch coupled between the second node of the read-transistor and a bit line node, the read select switch causing current from the read transistor to reach the bit line responsive to activating of the read select switch when the read transistor is active; and
a program select switch coupled between the first node of the BTBT device and a program select line, the program select switch causing current from the BTBT device to reach the program select line responsive to activating of the program select switch when the BTBT device is active.

2. The NVM cell of claim 1, wherein:
the BTBT device and the read-transistor have substantially a same gate area size.

3. The NVM cell of claim 1, wherein:
the BTBT device comprises a shallow trench isolation plug on an opposite side of a channel of the BTBT device from the first node.

4. The NVM cell of claim 1, comprising:
a capacitor coupled between a bias node and the floating gate and configured to adjust a voltage on the floating gate through application of a bias voltage at the bias node.

5. The NVM cell of claim 1, wherein:
the BTBT device is formed in a first region of semiconductor material, the first region of a first conductivity type; and
the read-transistor is formed in a second region of the semiconductor material, the second region of a second conductivity type.

6. The NVM cell of claim 5, comprising:
a first dielectric layer of a first thickness disposed between the floating gate and the first region of semiconductor material; and
a second dielectric layer of a second thickness disposed between the floating gate and the second region of semiconductor material.

7. The NVM cell of claim 6, wherein:
the thickness is greater than the second thickness.

8. A complementary metal oxide semiconductor (CMOS) wafer comprising:
a floating gate coupled to a non-volatile memory circuit;
a read transistor having:

a first body formed in a first region of semiconductor material, the first body of a first polarity type, a first dielectric layer of a first thickness disposed between the floating gate and the first body, and a source and a first drain each having a lightly doped drain (LDD) profile; and a Band-To-Band-Tunneling (BTBT) device having:

a second body formed in a second region of semiconductor material, the second body of the first polarity type, the second body having a threshold voltage adjustment implant, a second dielectric layer of a second thickness disposed between the floating gate and the second body, the second thickness thicker than the first thickness, a second drain having the LDD profile and a halo profile of a second polarity type, and a shallow trench isolation plug on an opposite side of a channel of the BTBT device from the second drain.

9. The wafer of claim 8, wherein:
the floating gate comprises a poly floating gate of the first polarity type.

10. The wafer of claim 8, wherein:
the first and second device have substantially a same gate area size.

11. The wafer of claim 8, comprising:
a capacitor coupled between a bias node and the floating gate and configured to adjust a voltage on the floating gate through application of a bias voltage at the bias node.

12. A non-volatile memory (NVM) cell, comprising:
a first floating gate transistor of a first conductivity type, the first floating gate transistor having a first drain region having a first dopant concentration, a source region having the first dopant concentration, a first floating gate, and a
first floating gate dielectric disposed between the first floating gate and a first substrate, the first floating gate dielectric having a first thickness;

a second floating gate transistor of the first conductivity type, the second floating gate transistor having a second drain region having a second dopant concentration, a shallow trench isolation plug, a second floating gate electrically coupled to the first floating gate, and a second floating gate dielectric disposed between the second floating gate and a second substrate, the second floating gate dielectric having a second thickness, the second floating gate transistor configured so that an injection current initiates band-to-band tunneling (BTBT) causing the second floating gate transistor to inject electrons onto the second floating gate; and a select circuitry disposed on the semiconductor substrate to selectively allow the injection current to reach the second floating gate transistor.

13. The NVM cell of claim 12, comprising:
a capacitor electrically coupled to the first and second floating gates and configured to adjust a voltage on the floating gates through application of a bias voltage.

14. The NVM cell of claim 12, wherein:
the first dopant concentration is less than the second dopant concentration.

15. The NVM cell of claim 12, wherein:
the first thickness is less than the second thickness.

16. The NVM cell of claim 12, wherein:
the first and second floating gates have substantially a same gate area size.

17. The NVM cell of claim 12, further comprising:
a first spacer disposed above the first substrate and horizontally adjacent to the first floating gate and the first floating gate dielectric, the first spacer limiting diffusion of a first dopant concentration underneath the first spacer and the first floating gate; and a second spacer disposed above the second substrate and horizontally adjacent to the second floating gate electrode and the second floating gate dielectric, the second spacer limiting diffusion of a second dopant concentration underneath the second spacer and the second floating gate, and the first dopant concentration being less than the second dopant concentration.

18. The NVM cell of claim 12, wherein:
the first floating gate transistor does not have a halo implant and the drain of the second floating gate transistor has a halo implant.

19. The NVM cell of claim 12, wherein:
the second floating gate transistor has a drain extension implant increasing a second dopant concentration underneath the second floating gate.

20. The NVM cell of claim 12, wherein:
the first floating gate transistor does not have a lightly doped drain (LDD) implant and the drain of the second floating gate transistor has an LDD implant.

* * * * *